(12) United States Patent
Chen et al.

(10) Patent No.: US 11,309,302 B2
(45) Date of Patent: Apr. 19, 2022

(54) MANUFACTURING METHOD OF SEMICONDUCTOR PACKAGE INCLUDING THERMAL CONDUCTIVE BLOCK

(71) Applicant: Taiwan Semiconductor Manufacturing Co., Ltd., Hsinchu (TW)

(72) Inventors: Shih-Wei Chen, Hsinchu (TW); Chih-Hua Chen, Hsinchu County (TW); Hsin-Yu Pan, Taipei (TW); Hao-Yi Tsai, Hsinchu (TW); Lipu Kris Chuang, Hsinchu (TW); Tin-Hao Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 20 days.

(21) Appl. No.: 16/898,409

(22) Filed: Jun. 10, 2020

(65) Prior Publication Data

US 2020/0303364 A1 Sep. 24, 2020

Related U.S. Application Data

(62) Division of application No. 16/103,938, filed on Aug. 15, 2018, now Pat. No. 10,720,416.

(51) Int. Cl.
*H01L 25/18* (2006.01)
*H01L 21/56* (2006.01)
(Continued)

(52) U.S. Cl.
CPC ............ *H01L 25/18* (2013.01); *H01L 21/563* (2013.01); *H01L 21/565* (2013.01);
(Continued)

(58) Field of Classification Search
CPC ....... H01L 23/34; H01L 23/345; H01L 23/42; H01L 23/433; H01L 23/4334;
(Continued)

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

WO    WO-2018057040 A1 *  3/2018  ......... H01L 23/5383

*Primary Examiner* — Sonya McCall-Shepard
(74) *Attorney, Agent, or Firm* — JCIPRNET

(57) ABSTRACT

Manufacturing method of semiconductor package includes following steps. Bottom package is provided. The bottom package includes a die and a redistribution structure electrically connected to die. A first top package and a second top package are disposed on a surface of the redistribution structure further away from the die. An underfill is formed into the space between the first and second top packages and between the first and second top packages and the bottom package. The underfill covers at least a side surface of the first top package and a side surface of the second top package. A hole is opened in the underfill within an area overlapping with the die between the side surface of the first top package and the side surface of the second top package. A thermally conductive block is formed in the hole by filling the hole with a thermally conductive material.

20 Claims, 23 Drawing Sheets

(51) Int. Cl.
*H01L 23/31* (2006.01)
*H01L 23/34* (2006.01)
*H01L 23/528* (2006.01)
*H01L 23/00* (2006.01)
*H01L 23/522* (2006.01)
*H01L 23/538* (2006.01)
*H01L 25/10* (2006.01)
*H01L 21/683* (2006.01)

(52) U.S. Cl.
CPC .......... *H01L 23/3128* (2013.01); *H01L 23/34* (2013.01); *H01L 23/5226* (2013.01); *H01L 23/5283* (2013.01); *H01L 24/09* (2013.01); *H01L 24/17* (2013.01); *H01L 24/33* (2013.01); *H01L 24/49* (2013.01); *H01L 24/73* (2013.01); *H01L 2224/023* (2013.01); *H01L 2224/0231* (2013.01); *H01L 2224/02373* (2013.01); *H01L 2224/02381* (2013.01); *H01L 2224/0401* (2013.01); *H01L 2224/73203* (2013.01); *H01L 2224/73257* (2013.01); *H01L 2224/73265* (2013.01)

(58) Field of Classification Search
CPC ... H01L 23/367; H01L 23/3675; H01L 23/36; H01L 23/373; H01L 2023/4037; H01L 2023/4043; H01L 2023/405; H01L 2023/4068; H01L 21/4871; H01L 21/4814; H01L 25/043; H01L 25/0657; H01L 25/074; H01L 25/0756; H01L 25/117; H01L 2225/06503–0652; H01L 2225/06582–06589; H01L 25/042; H01L 25/0655; H01L 25/072; H01L 25/0753; H01L 25/115; H01L 2225/10–1023; H01L 2225/1094; H01L 23/31–3192; H01L 2225/06589; H01L 25/0652; H01L 25/071; H01L 25/112

See application file for complete search history.

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2014/0231972 | A1* | 8/2014 | Hsu .................. H01L 21/56 257/659 |
| 2016/0276308 | A1* | 9/2016 | Min .................. H01L 23/3128 |
| 2018/0190569 | A1* | 7/2018 | Fu .................. H01L 24/16 |

* cited by examiner

MANUFACTURING METHOD OF SEMICONDUCTOR PACKAGE INCLUDING THERMAL CONDUCTIVE BLOCK

CROSS-REFERENCE

This application is a divisional application of and claims the priority benefit of U.S. patent application Ser. No. 16/103,938, filed on Aug. 15, 2018, now allowed. The entirety of the above-mentioned patent application is hereby incorporated by reference herein and made a part of this specification.

BACKGROUND

As electronic products are continuously miniaturized, heat dissipation of the packaged semiconductor dies has become an important issue for packaging technology. In addition, for multi-die packages, the arrangement of the dies and the corresponding connecting elements has impacts on data transmission speed and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
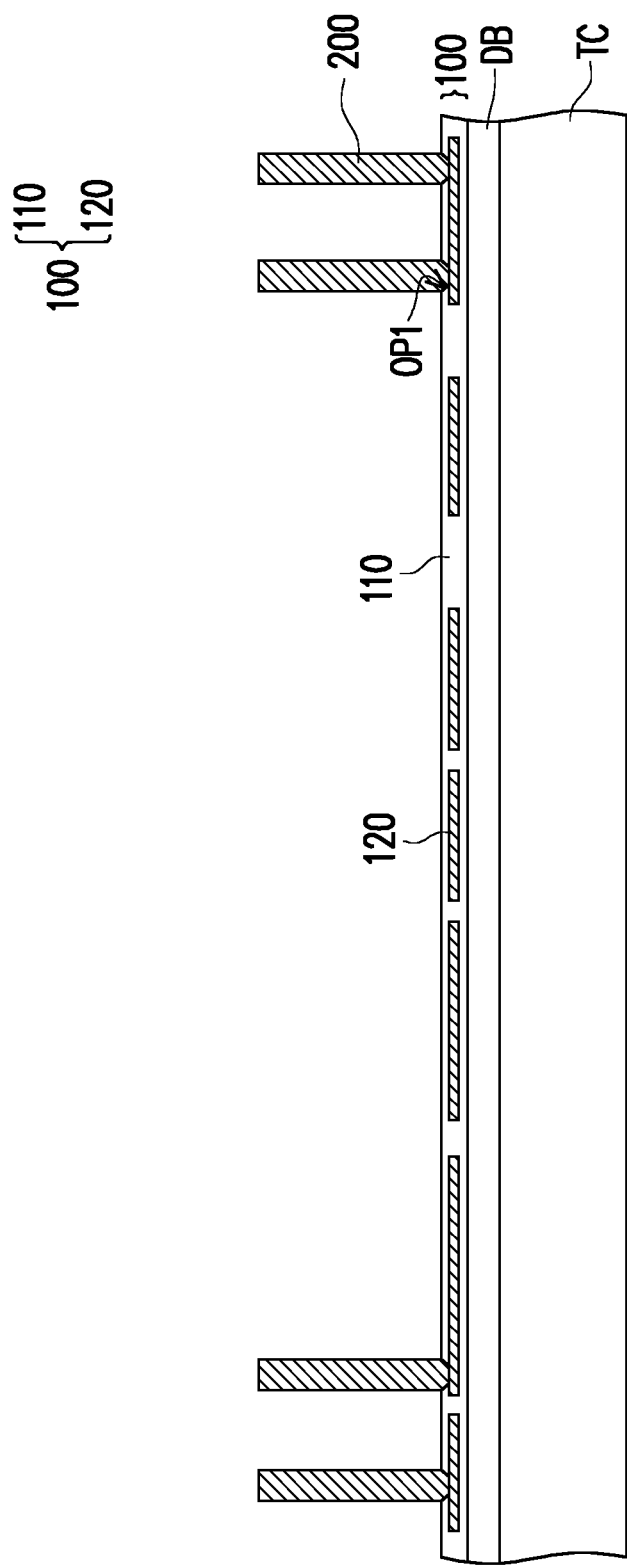
FIG. 1A through FIG. 1L show schematic cross-sectional views of structures produced at various stages of a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure describe the exemplary manufacturing process of package structures and the package structures fabricated there-from. Certain embodiments of the present disclosure are related to the package structures formed with a heat dissipating structure. The wafers or dies may include one or more types of integrated circuits or electrical components on a bulk semiconductor substrate or a silicon/germanium-on-insulator substrate. The embodiments are intended to provide further explanations but are not to be used to limit the scope of the present disclosure.

Figure 1B:
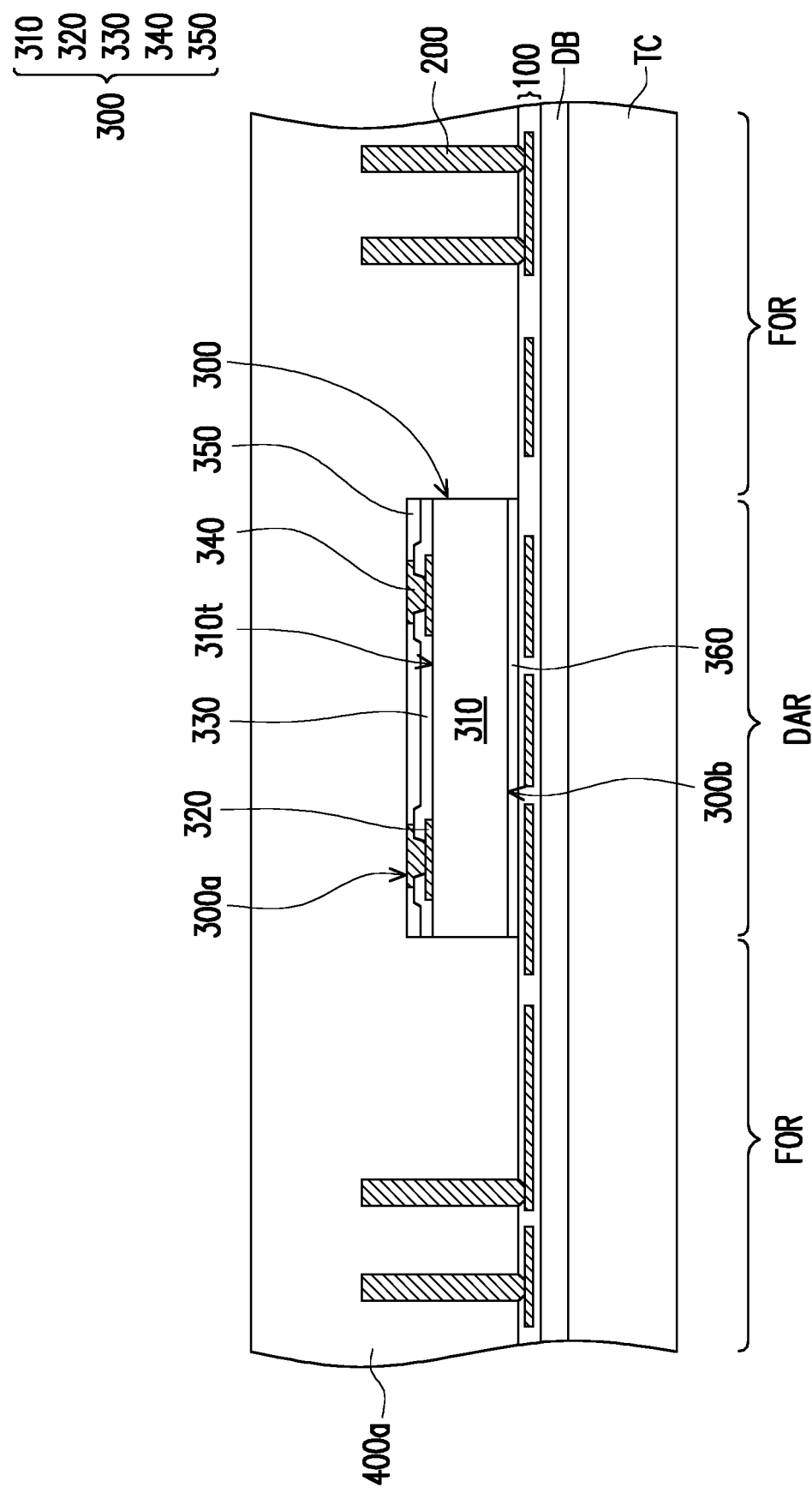
Figure 1C:
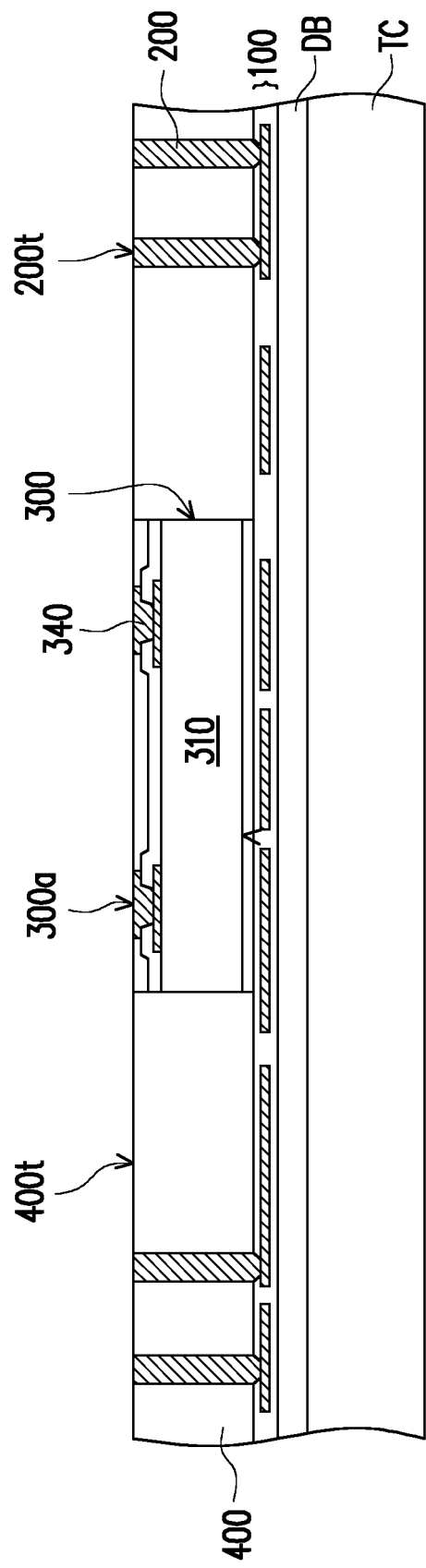
Figure 1D:
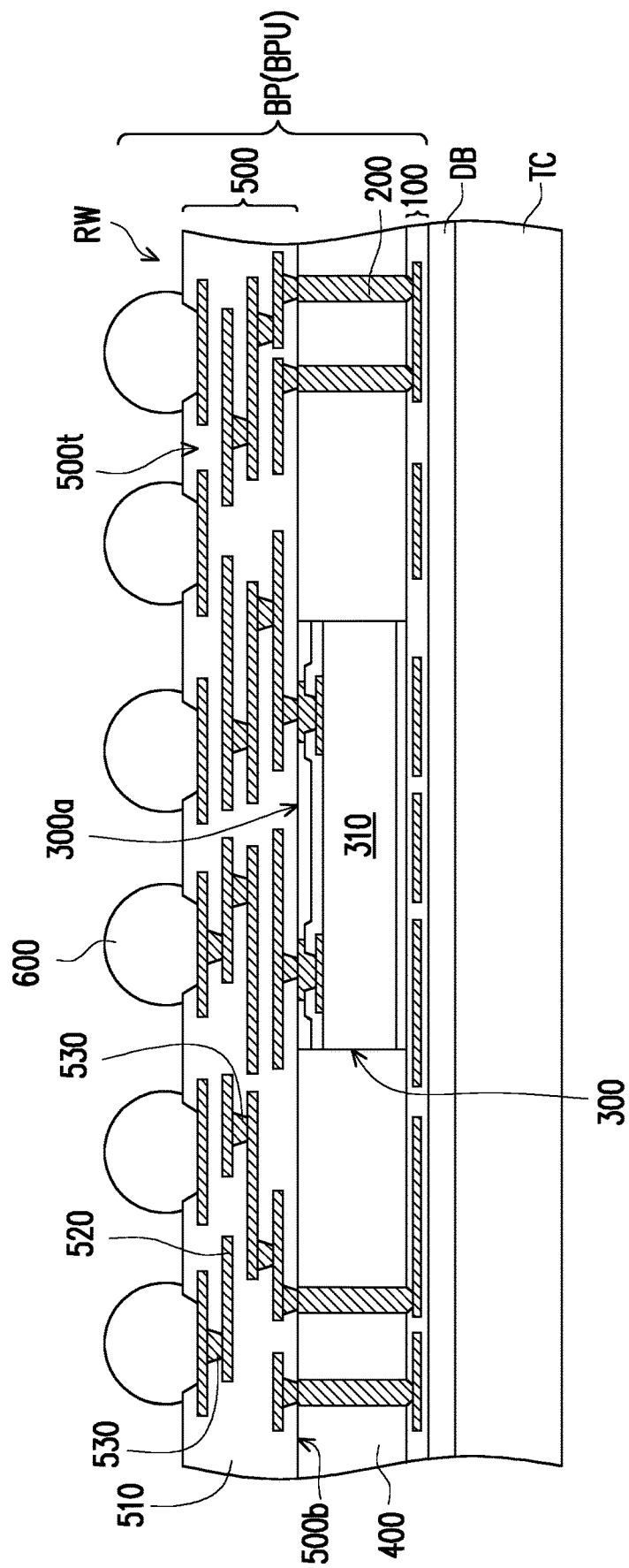
Figure 1E:
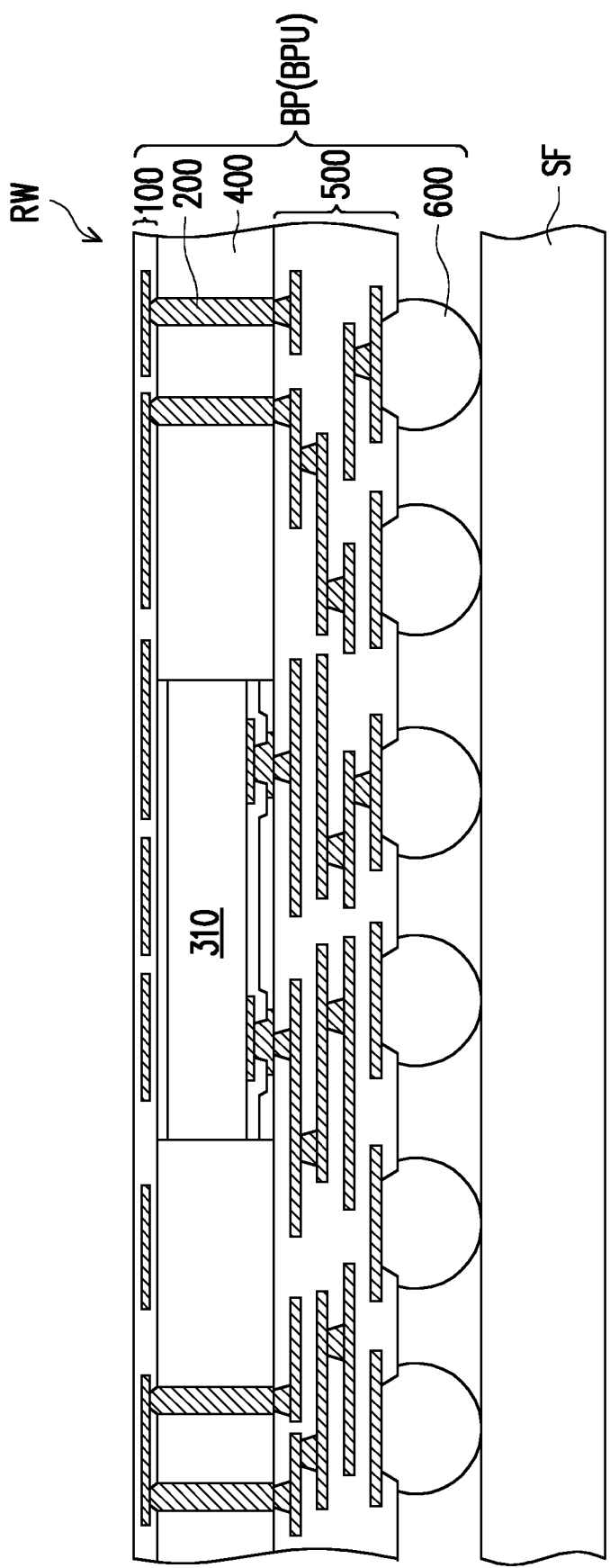
Figure 1F:
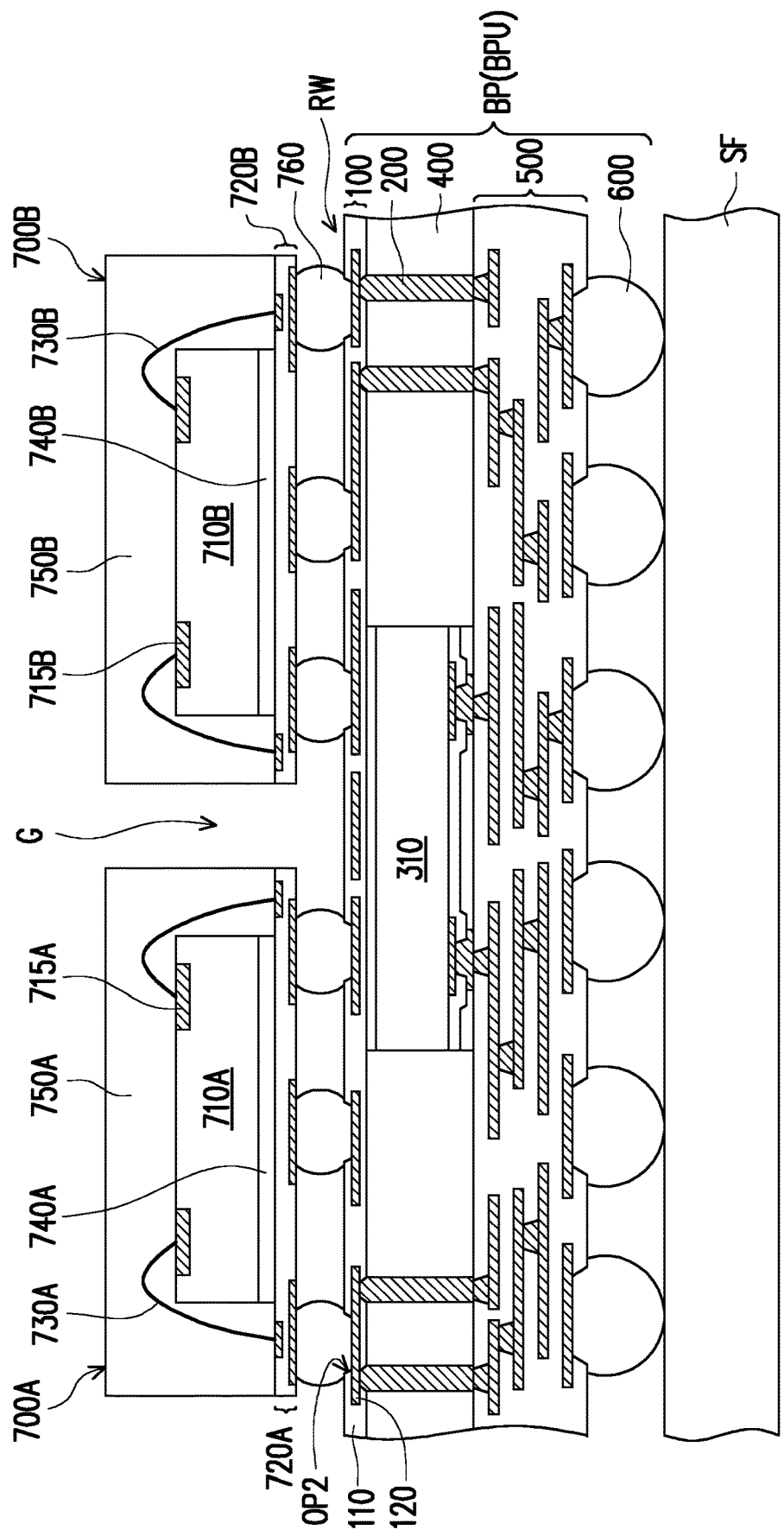
Figure 1G:
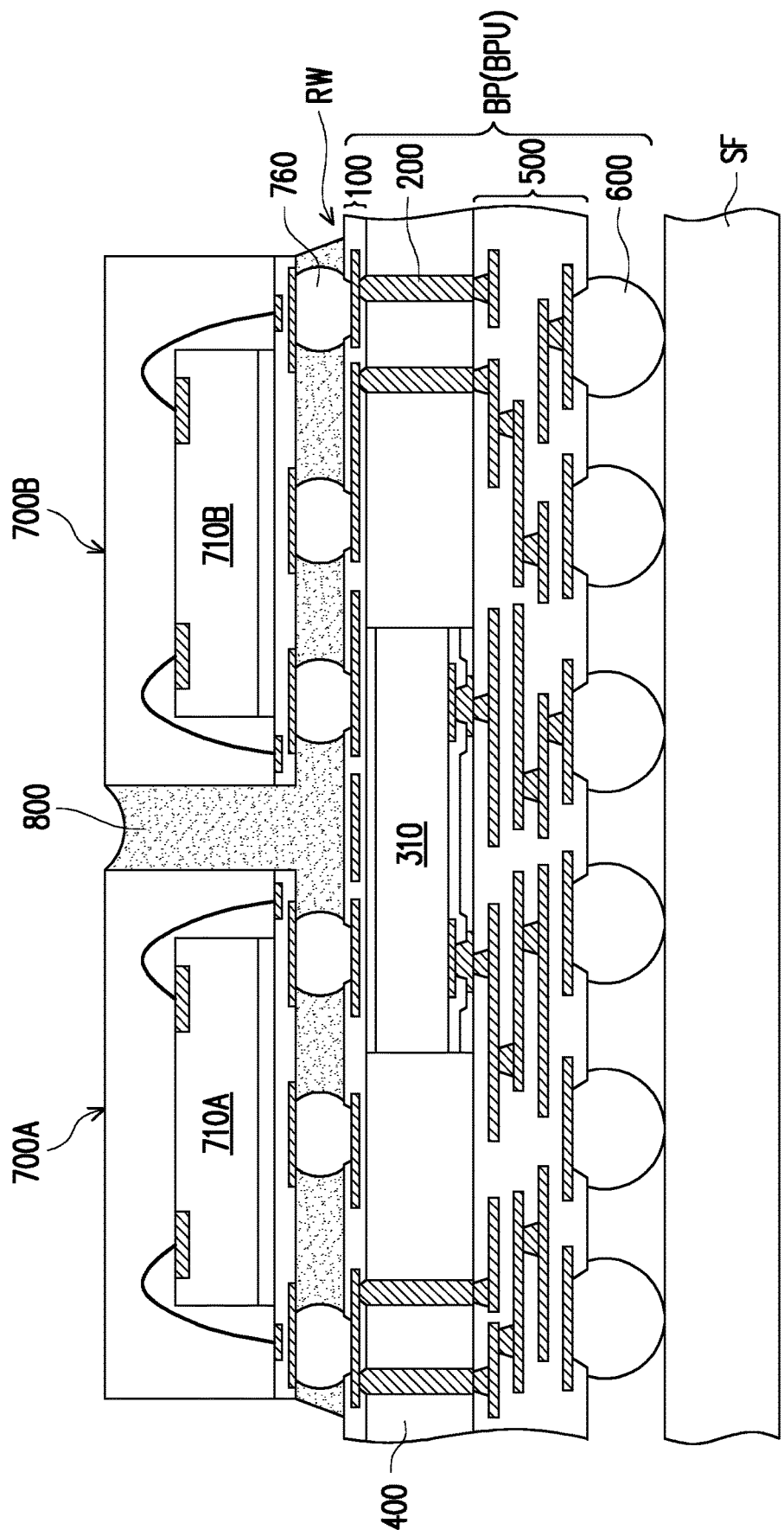
Figure 1H:
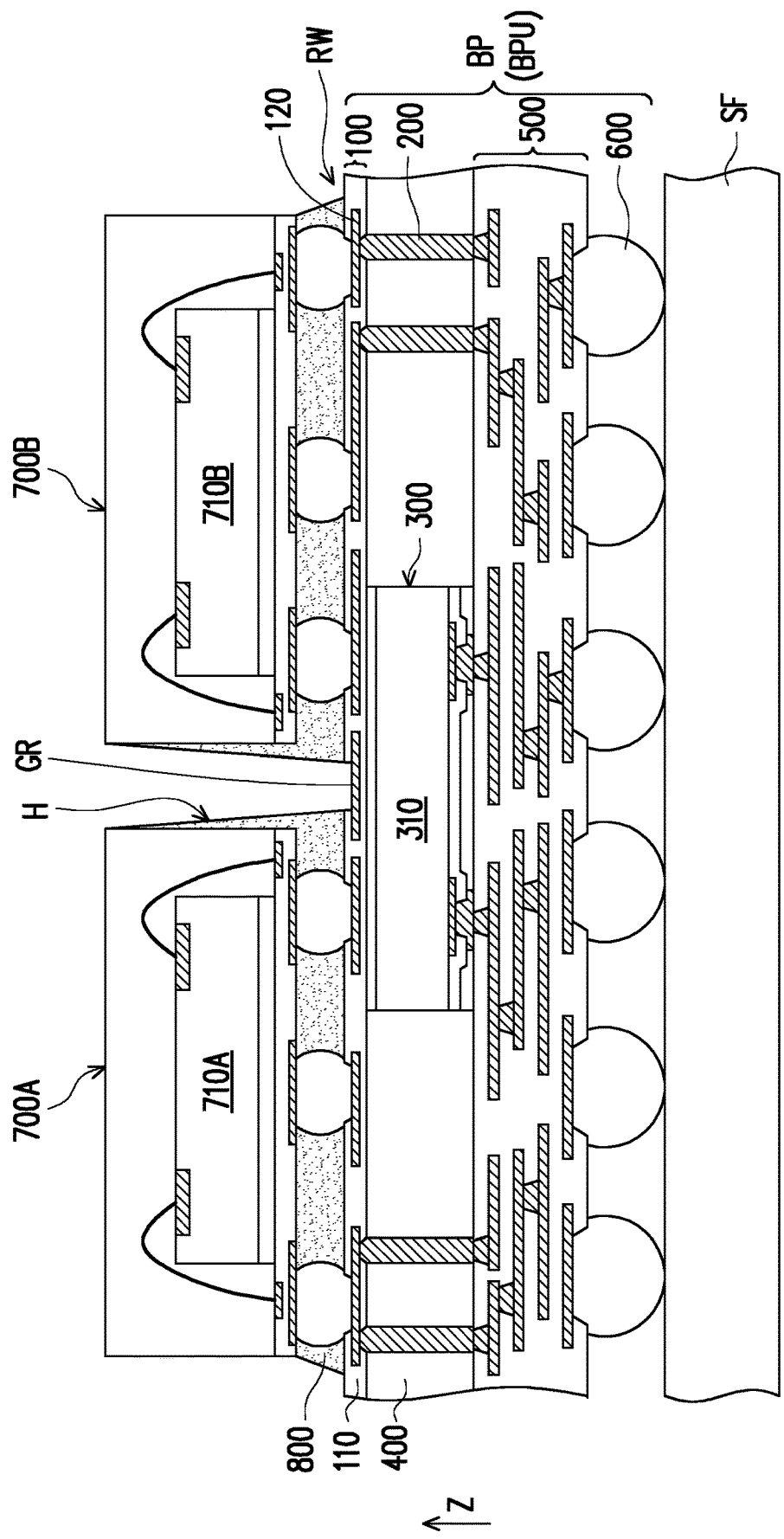
Figure 1I:
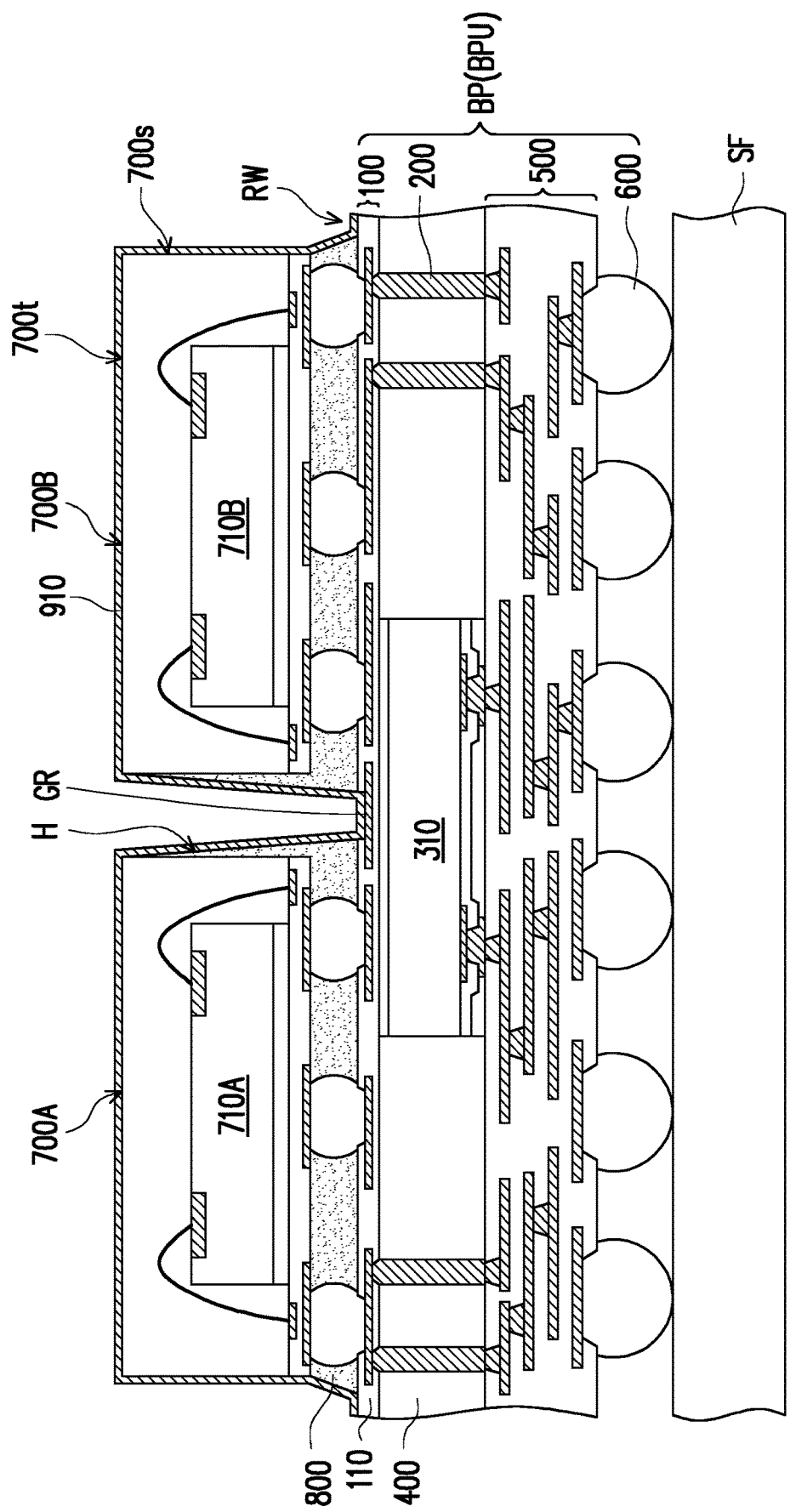
Figure 1J:
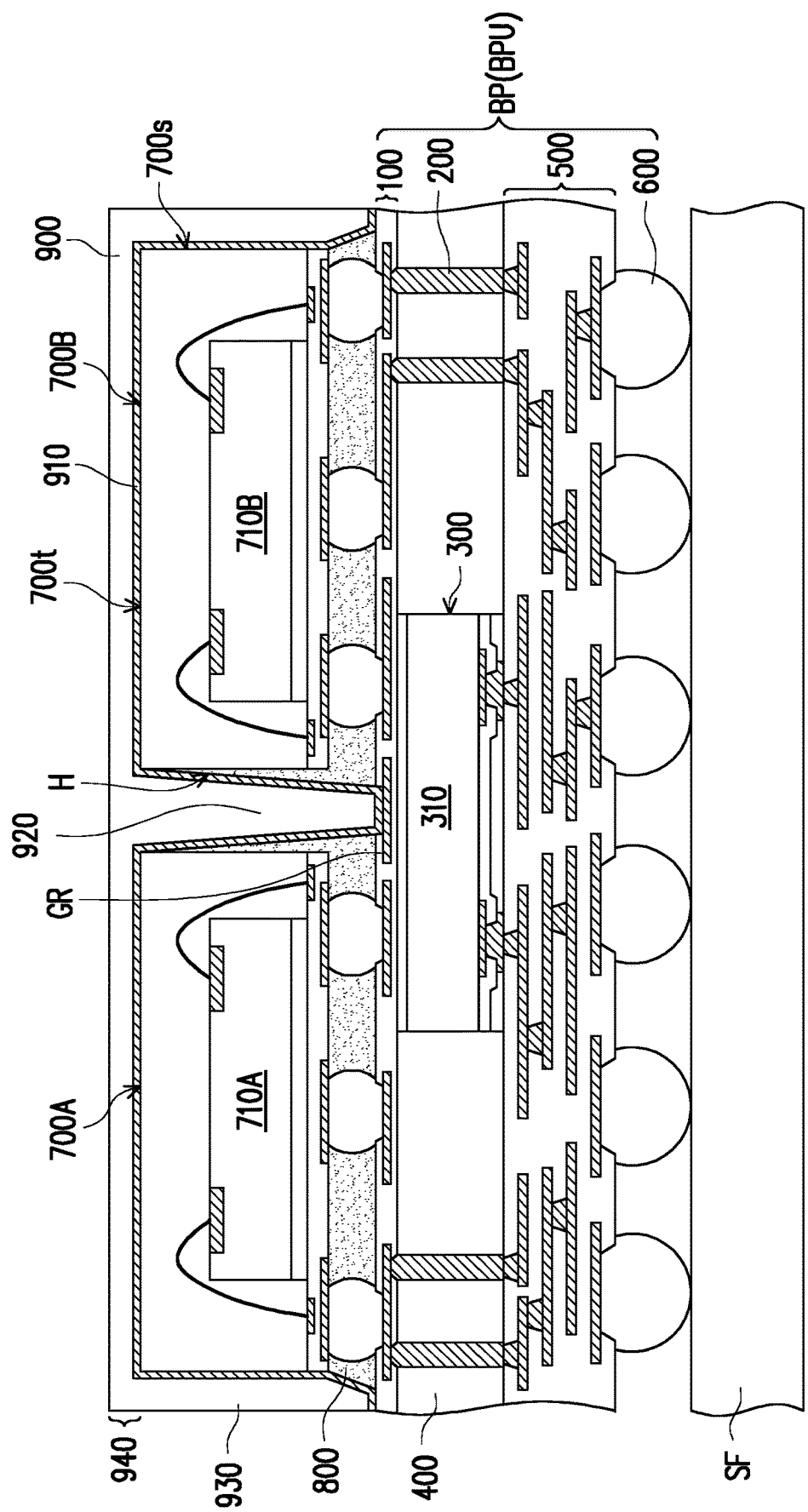
Figure 1K:
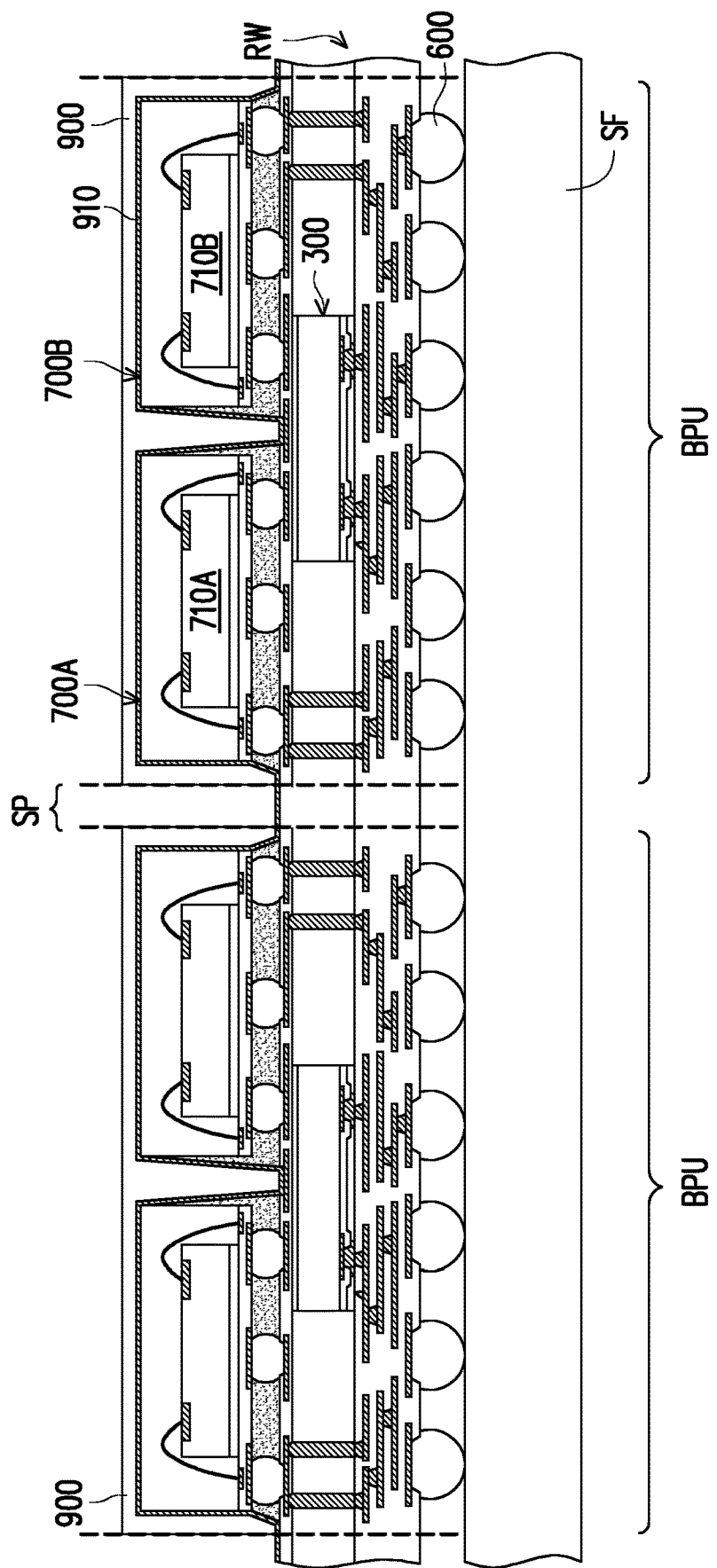
Figure 1L:
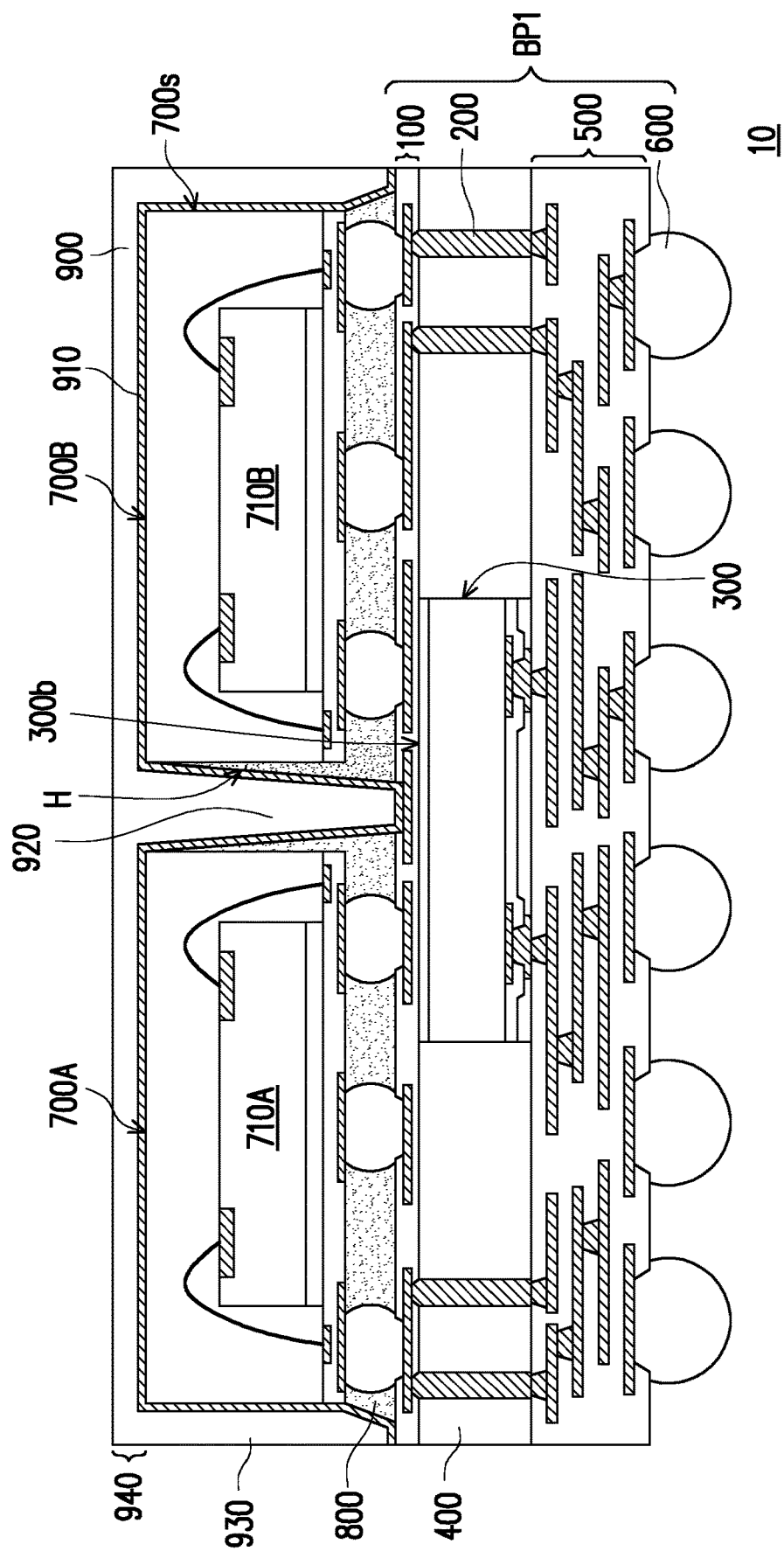

FIG. 1A through FIG. 1L show schematic cross-sectional views illustrating structures produced at various stages of a manufacturing method of a semiconductor package 10 shown in FIG. 1L. Referring to FIG. 1A, a temporary carrier TC having a de-bonding layer DB formed thereon is provided. In some embodiments, the temporary carrier TC is a glass substrate, a metal plate, a plastic supporting board or the like, but other suitable substrate materials may be used as long as the materials are able to withstand the subsequent steps of the process. In some embodiments, the de-bonding layer DB includes a light-to-heat conversion (LTHC) release layer, which facilitates peeling the temporary carrier TC away from the semiconductor package when required by the manufacturing process.

In some embodiments, referring to FIG. 1A, a redistribution structure 100 is formed over the carrier TC. In some embodiments, the redistribution structure 100 is formed on and temporarily attached with the de-bonding layer DB. In some embodiments, the redistribution structure 100 includes at least one dielectric layer 110 and at least one redistribution conductive layer 120. The redistribution conductive layer 120 may be constituted by a plurality of redistribution conductive patterns. For simplicity, the dielectric layer 110 is illustrated as one single layer of dielectric layer and the redistribution conductive layer 120 is illustrated as embedded in the dielectric layer 110 in FIG. 1A. Nevertheless, from the perspective of the manufacturing process, the dielectric layer 110 is constituted by at least two dielectric layers and the redistribution conductive layer 112 is sandwiched between two adjacent dielectric layers. In some embodiments, a material of the redistribution conductive layer 120 includes aluminum, titanium, copper, nickel, tungsten, and/or alloys thereof. The redistribution conductive layer 120 may be formed by, for example, electroplating, deposition, and/or photolithography and etching. In some embodiments, the material of the dielectric layer 110 includes polyimide, epoxy resin, acrylic resin, phenol resin, benzocyclobutene (BCB), polybenzooxazole (PBO), or any other suitable polymer-based dielectric material. The dielectric layer 110, for example, may be formed by suitable fabrication techniques such as spin-on coating, chemical vapor deposition (CVD), plasma-enhanced chemical vapor deposition (PECVD), or the like. It should be noted that the number of the redistribution conductive layers 120 and the number of the dielectric layers 110 illustrated in FIG. 1A are merely for illustrative purposes, and the disclosure is not limited thereto. In some alternative embodiments, more layers of the redistribution conductive layer 120 and more layers of the dielectric layer 110 may be formed depending on the circuit design. When the redistribution structure 100 includes multiple redistribution conductive layers 120 and multiple dielectric layers 110, these redistribution conductive layers 120 and these dielectric layers 110 are stacked alternately, and the redistribution conductive layers 120 may be interconnected with one another by conductive vias (not shown).

In some embodiments, the topmost dielectric layer 110 has a plurality of contact openings OP1 formed therein, and the contact openings OP1 expose portions of the redistribution conductive layer 120. In some embodiments, a plurality of conductive structures 200 physically contacts the redistribution conductive layer 120 through the contact openings OP1 to establish electrical connection. In some embodiments, the conductive structures 200 are conductive pillars formed on the redistribution conductive layer 120 by a photolithography process, a plating process, a photoresist stripping processes, and/or any other suitable processes. For example, a mask pattern (not shown) covering the redistribution structure 100 with openings exposing the contact openings OP1 is formed. Thereafter, a metallic material (not shown) is filled into the openings and the contact openings OP1 by electroplating or deposition. Then, the mask pattern is removed to obtain the conductive structures 200. However, the disclosure is not limited thereto, and other suitable methods may be utilized in the formation of the conductive structures 200. In some embodiments, the material of the conductive structures 200 includes a metal material such as copper, copper alloys, or the like. It should be noted that four conductive structures 200 are presented in FIG. 1A for illustrative purposes; however, more or fewer conductive structures 200 may be formed in some alternative embodiments. The number of the conductive structures 200 may be selected based on design and production requirements.

Referring to FIG. 1B, a semiconductor die 300 is provided on the redistribution structure 100. In some embodiments, the semiconductor die 300 is placed beside and between the conductive structures 200. For example, the conductive structures 200 may be arranged to surround the semiconductor die 300. In some embodiments, the semiconductor die 300 is placed onto the redistribution structure 100 through a pick-and-place method. Even though only one semiconductor die 300 is presented in FIG. 1A for illustrative purposes, it is understood that a plurality of semiconductor dies 300 are provided on the redistribution structure 100 for wafer-level packaging technology. In some embodiments, the semiconductor die 300 includes a semiconductor substrate 310, a plurality of contact pads 320 and a passivation layer 330. The contact pads 320 may be formed on a top surface 310t of the semiconductor substrate 310. The passivation layer 330 may cover the top surface 310t and have a plurality of openings that exposes at least a portion of each contact pad 320. In some embodiments, the semiconductor die 300 may further include a plurality of conductive posts 340 filling the openings of the passivation layer 330 and electrically connected to the contact pads 320, and a protective layer 350 surrounding the conductive posts 340. In some embodiments, as the semiconductor die 300 is placed on the redistribution structure 100 in a face-up configuration (active surface 300a of the semiconductor die 300 facing upward in FIG. 1B), the redistribution structure 100 is referred to as a back-side redistribution structure.

In some embodiments, the semiconductor substrate 310 may be made of semiconductor materials, such as semiconductor materials of the groups III-V of the periodic table. In some embodiments, the semiconductor substrate 310 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 310 includes active components (e.g., transistors or the like) and optionally passive components (e.g., resistors, capacitors, inductors, or the like) formed therein. The semiconductor die 300 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 300 includes a memory die such as a high bandwidth memory die. In certain embodiments, the contact pads 320 include aluminum pads, copper pads, or other suitable metal pads. In some embodiments, the passivation layer 330 may be a single layer or a multi-layered structure, including a silicon oxide layer, a silicon nitride layer, a silicon oxy-nitride layer, a dielectric layer formed by other suitable dielectric materials or combinations thereof. In some embodiments, the material of the conductive posts 340 includes copper, copper alloys, or other conductive materials, and may be formed by deposition, plating, or other suitable techniques.

In some embodiments, the semiconductor die 300 has an active surface 300a and a back surface 300b opposite to the active surface 300a. In some embodiments, as illustrated in FIG. 1B, the semiconductor die 300 is attached to the redistribution structure 100 through an adhesive layer 360. In other words, the back surface 300b of the semiconductor die 300 is attached to the adhesive layer 360. In some embodiments, the adhesive layer 360 may include a die attach film. In some embodiments, the semiconductor die 300 is disposed in a die attach region DAR of the redistribution structure 100, whilst the conductive structure 200 are formed in a fan-out region FOR surrounding the die attach region DAR. In some embodiments, the conductive structures 200 are formed prior to the placement of the semiconductor die 300.

Referring to FIG. 1B, an encapsulation material 400a is formed over the redistribution structure 100 above the carrier TC to at least encapsulate the semiconductor die(s)

300 and the conductive structures 200. In some embodiments, not only the semiconductor die(s) 300 but also the conductive structures 200 are fully covered and not revealed by the encapsulation material 400a. In some embodiments, the encapsulation material 400a may be a molding compound, a molding underfill, a resin (such as an epoxy resin), or the like. In some embodiments, the encapsulation material 400a is formed by an over-molding process. In some embodiments, the encapsulation material 400a is formed by a compression molding process.

Referring to FIG. 1B and FIG. 1C, in some embodiments, the encapsulation material 400a is partially removed by a planarization process until the conductive posts 340 of the semiconductor die(s) 300 are exposed. That is, the active surface 300a of the semiconductor die 300 is exposed. In some embodiments, upper portions of the conductive structures 200a may be removed during the planarization process. Planarization of the encapsulation material 400a may produce an encapsulant 400 located over the redistribution structure 100 to surround the conductive structures 200 and the semiconductor dies 300, but top surfaces 200t of the conductive structures 200 and the active surface 300a of the semiconductor die 300 are exposed from the encapsulant 400. In some embodiments, the planarization of the encapsulation material 400a includes performing a mechanical grinding process and/or a chemical mechanical polishing (CMP) process. After the grinding process or the polishing process, the top surfaces 200t of the conductive structures 200 may be substantially coplanar with a top surface 400t of the encapsulant 400.

As shown in FIG. 1D, in some embodiments, a redistribution structure 500 is subsequently formed over the encapsulant 400 and formed above the conductive structures 200 and the semiconductor die(s) 300. As shown in FIG. 1D, the redistribution structure 500 includes one or more dielectric layers 510, one or more conductive layers 520, and a plurality of interconnecting vias 530. The interconnecting vias 530 and the conductive layers 520 are embedded in the dielectric layers 510. In some embodiments, the redistribution structure 500 facing the active surface 300a of the semiconductor die 300 is referred to as a front-side redistribution structure. In some embodiments, the manufacturing process and the materials used to fabricate the front-side redistribution structure 500 are the same or similar to what previously described for the back-side redistribution structure 100, and a detailed description thereof is omitted for the sake of brevity. It should be noted that the number of the conductive layers 520 and the number of the dielectric layers 510 may be adapted according to the design requirement, and do not constitute a limitation of the disclosure. In some alternative embodiments, more or fewer conductive layers 520 and more or fewer dielectric layers 510 may be formed depending on the circuit design.

Referring to FIG. 1D, at least portions of the conductive vias 530 exposed from a bottom surface 500b of the redistribution structure 500 are connected to the conductive structures 200 and to the semiconductor die 300. In some embodiments, a plurality of connective terminals 600 is disposed on the topmost conductive layer 520 of the redistribution structure 500, and the connective terminals 600 are electrically connected with the redistribution structure 500. Furthermore, a plurality of under bump metallurgies (not shown) may be provided between the conductive terminals 600 and the topmost conductive layer 520 for better adhesion and connection reliability. In some embodiments, the connective terminals 600 include ball grid array (BGA) balls or solder balls. In some embodiments, the connective terminals 600 may be placed on the under-bump metallurgies through a ball placement process. With the formation of the connective terminals 600, a bottom package structure BP is obtained. In some embodiments, the bottom package structure BP is in a form of a reconstructed wafer RW, and the reconstructed wafer RW includes a plurality of bottom package units BPU. In FIG. 1D, only a single bottom package unit BPU is shown for simplicity. In other words, the exemplary processes may be performed at a reconstructed wafer level, so that multiple bottom package units BPU are processed in the form of the reconstructed wafer RW.

In some embodiments, the reconstructed wafer RW is overturned and placed onto a supporting frame SF, as shown in FIG. 1E. Referring to both of FIG. 1D and FIG. 1E, the de-bonding layer DB and the temporary carrier TC are detached from the reconstructed wafer RW and then removed. In some embodiments, the de-bonding layer DB (e.g., the LTHC release layer) is irradiated with a UV laser so that the carrier TC and the de-bonding layer DB are easily peeled off from the bottom package units BPU. Nevertheless, the de-bonding process is not limited thereto, and other suitable de-bonding methods may be used in some alternative embodiments.

The reconstructed wafer RW may be disposed on the supporting frame SF with the front-side redistribution structure 500 facing the supporting frame SF, and the back-side redistribution structure 100 may be exposed and available for further processing.

As shown in FIG. 1F, a plurality of openings OP2 may be formed in the now exposed dielectric layer 110 of the redistribution structure 100, partially revealing the redistribution conductive layer 120. In some embodiments, one or more top packages 700A, 700B are provided and disposed on the back-side redistribution structure 100. In some embodiments, the top packages 700A, 700B are electrically connected with the bottom package unit BPU through the back-side redistribution structure 100, the conductive structures 200 and the front-side redistribution structure 500. In some embodiments, as shown in FIG. 1F, two top packages 700A, 700B are connected to one bottom package unit BPU. It should be noted that the number of top packages connected to the bottom package units BPU is not limited to two according to the exemplary embodiments of the present disclosure. In some alternative embodiments, fewer or more than two top packages may be provided and connected to the bottom package unit BPU.

In some embodiments, the top package 700A includes a first chip 710A. The first chip 710A has a plurality of contact pads 715A and is electrically connected to a redistribution structure 720A. In some embodiments, the top package 700B includes a second chip 710B having a plurality of contact pads 715B electrically connected to a redistribution structure 720B. In some embodiments, each of the chips 710A, 710B may be independently disposed in a face-up configuration, and electrical connection with the corresponding redistribution structure 720A or 720B may be established through a plurality of conductive wires 730A or 730B. In some embodiments, a material of the conductive wires 730A or 730B includes copper, gold, or alloy thereof. In some embodiments, a die attach film 740A or 740B is disposed between the chip 710A or 710B and the corresponding redistribution structure 720A or 720B. An encapsulant 750A or 750B may be disposed over the corresponding redistribution structure 720A or 720B to embed the chip 710A or 710B and the conductive wires 730A or 730B. In some embodiments, the top packages 700A and 700B are the same type packages and the chips 710A and 710B belongs to the same type of chips or perform the same or similar functions. In some embodiments, the top packages 700A and 700B are different types of packages and the chips 710A and 710B are different types of chips or perform different functions. In some embodiments, the chip 710A or 710B may be or include a memory die. In some alternative embodiments, the chip 710A or 710B may be or include a logic die. A plurality of conductive balls 760 may electrically connect the redistribution structures 720A, 720B of the top packages 700A, 700B and the back-side redistribution structure 100. In some embodiments, the conductive balls 760 include BGA balls or solder bumps, and the top packages 700A, 700B are flip-chip bonded to the redistribution structure 100 of the bottom package unit BPU through the conductive balls 760. In some embodiments, as shown in FIG. 1F, the top packages 700A and 700B are arranged side by side with a gap G separating the two top packages 700A, 700B.

With reference to FIG. 1G, an underfill 800 may be provided to fill the interstices between the top packages 700A, 700B and the back-side redistribution structure 100. The underfill 800 may at least partially fill the gap G (see FIG. 1F) between the top packages 700A, 700B. The underfill 800 may help protect the conductive balls 760 against thermal or physical stresses. In some embodiments, a material for the underfill 800 includes polymeric materials or resins. In some embodiments, the underfill 800 is formed by capillary underfill filling (CUF). A dispenser (not shown) may apply a filling material (not shown) along the perimeter of the top packages 700A, 700B. In some embodiments, the underfill 800 is formed by molding. In some embodiments, heating may be applied to let the filling material penetrate in the interstices defined by the conductive balls 760 between the top packages 700A, 700B and the redistribution structure 100 by capillarity. In some embodiments, a curing process is performed to consolidate the underfill 800. It should be noted that whilst in FIG. 1G the underfill 800 is shown to almost entirely fill the gap G in between the top packages 700A, 700B, in some embodiments a height level reached by the underfill 800 (i.e., a degree of filling of the gap G), may be a function of the distance between the two top packages, as from said distance might depend the capillary forces experienced by the underfill material during the capillary underfill filling step. In some embodiments, the underfill 800 may reach a lower height level than the one shown in FIG. 1G. The height level reached by the underfill is not to be construed as a limitation of the disclosure.

In some embodiments, as shown in FIG. 1H, a hole H is formed in the underfill 800 in the region corresponding to the gap G (see FIG. 1F) between the top packages 700A, 700B. In some embodiments, the hole H is opened via laser drilling. By tuning the power of the laser, it is possible to remove a portion of the underfill 800 until reaching the back-side redistribution structure 100. In some embodiments, the laser drills through the underfill 800 and the topmost dielectric layer 110 of the redistribution structure 100 until reaching the conductive layer 120. In some embodiments, the conductive layer 120 includes a conductive pattern embedded in the back-side redistribution structure 100 and located above the semiconductor die 300. In some embodiments, the laser drilling for opening the hole H stops at the conductive pattern (i.e. laser drilling stops when the conductive pattern is exposed). In some embodiments, the conductive pattern includes a conductive ground plane GR or functions as a conductive ground plane for the package. In some embodiments, as shown in FIG. 1H, the hole H exposes at least a portion of the conductive ground plane GR. It should be noted that whilst in FIG. 1H the hole H is shown to extend for only a portion of the gap G between the two top packages 700A, 700B, the disclosure is not limited thereto. In some alternative embodiments, the hole H can extend up to the entire gap G. Furthermore, while the hole H is shown having a somewhat tapered profile defined by the underfill 800, the disclosure is not limited thereto. In some embodiments, the inner side surfaces of the underfill 800 defining the hole H may have a substantially vertical profile.

Figure 2A:
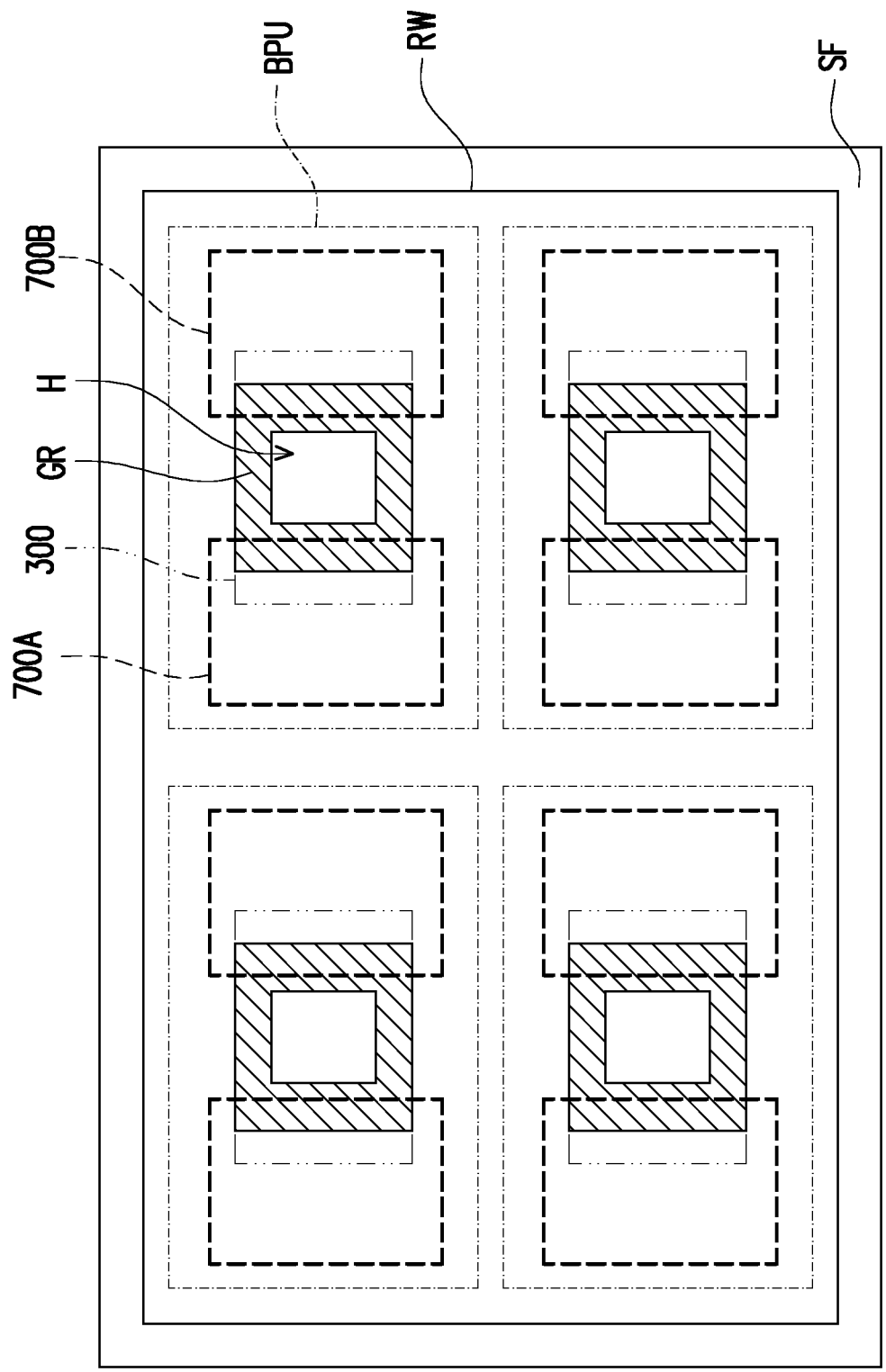
FIG. 2A through FIG. 2C show schematic top views of manufacturing intermediates of semiconductor packages according to some embodiments of the present disclosure.
Figure 2B:
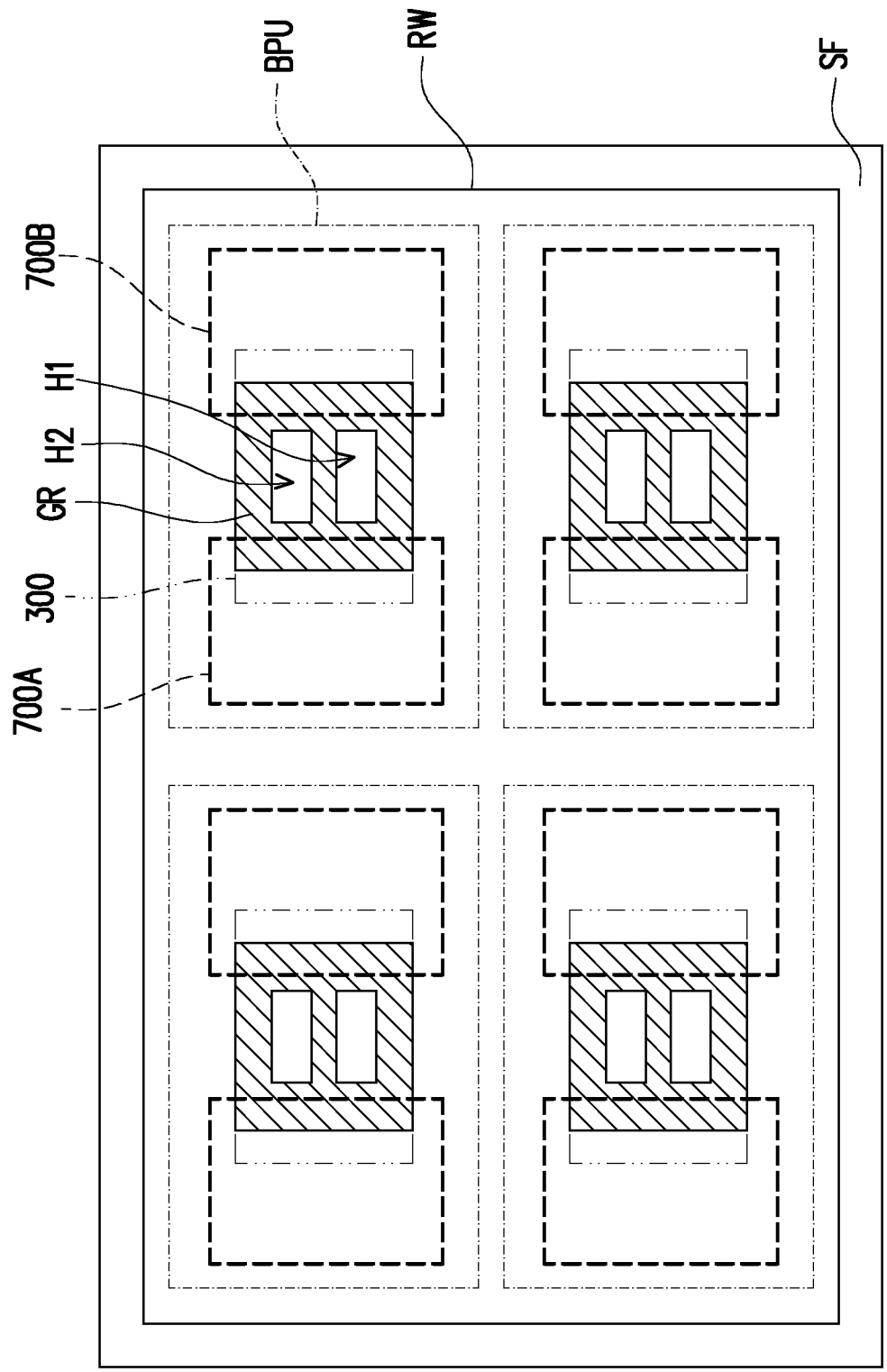
Figure 2C:
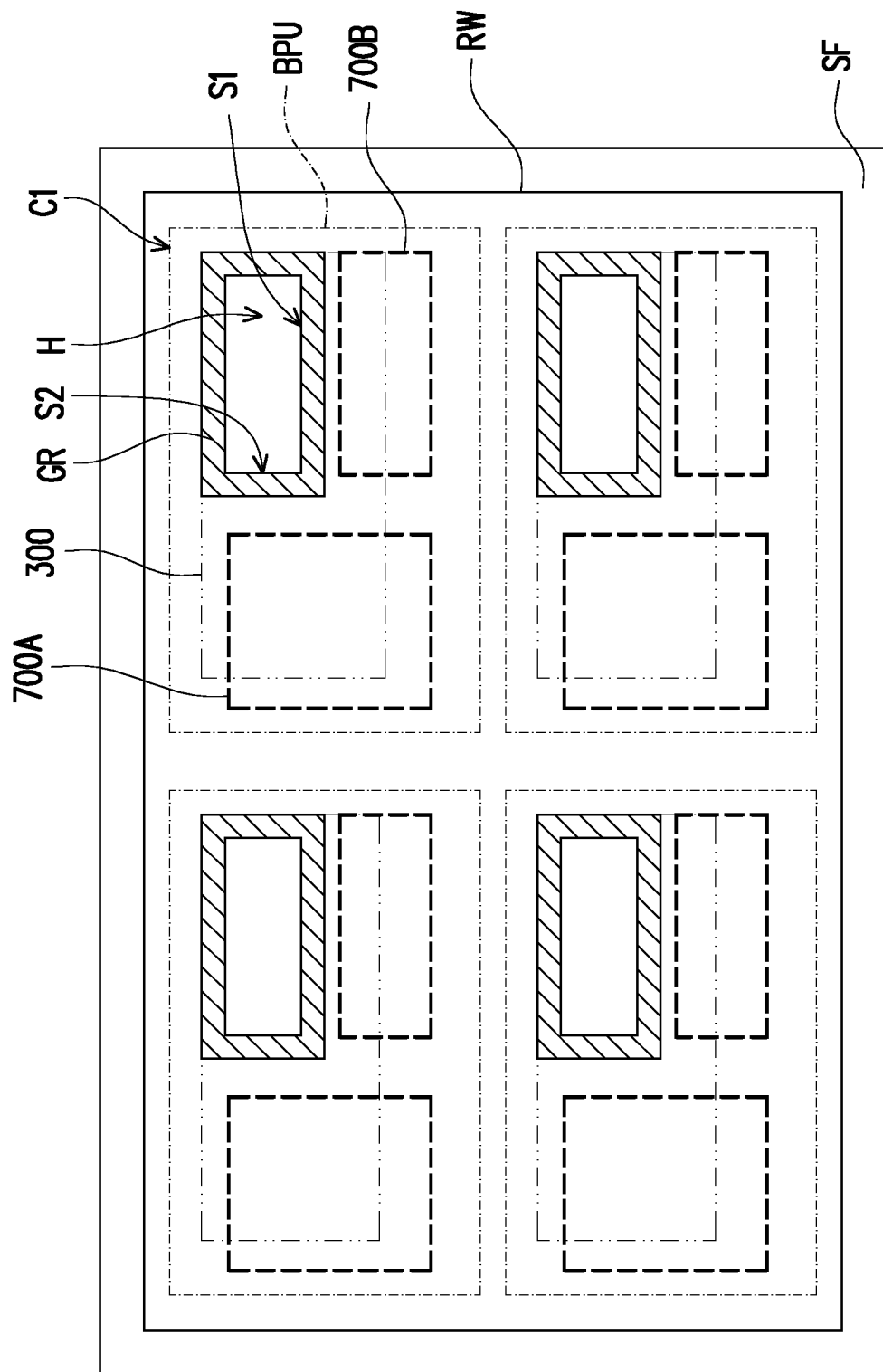

Whilst in FIG. 1H the hole H is shown to extend in the gap G (shown in FIG. 1F) between the two top packages 700A, 700B, the disclosure is not limited thereto. In FIG. 2A to FIG. 2C are illustrated schematic top views of manufacturing intermediates corresponding to the stage illustrated in FIG. 1H according to some embodiments of the present disclosure. In FIG. 2A is illustrated a top view of the manufacturing intermediate of FIG. 1H. Referring simultaneously to FIG. 2A and FIG. 1H, the reconstructed wafer RW is shown disposed on the supporting frame SF. According to FIG. 2A, four bottom package units BPU are shown in the reconstructed wafer RW, but, of course, this is for illustrative purposes only, and the disclosure is not limited by the number of bottom package units BPU being produced in the reconstructed wafer RW. The outlined area labeled as 300 corresponds to the position of the semiconductor die 300 within each of the bottom package units BPU. Similarly, the outlined areas labeled as 700A and 700B correspond to the positions of to the top packages 700A and 700B, respectively. The area labelled as GR corresponds to the position of the conductive ground plane GR in the redistribution structure 100, and, similarly, the area labelled as H corresponds to the position of the hole H. As shown in FIG. 2A, viewing from the top view along the vertical direction (the thickness direction Z in FIG. 1H), the position of the hole H overlaps with the conductive ground plane GR and overlaps with the semiconductor die 300 of the bottom package unit BPU. In some embodiments, a vertical projection of the outline of the hole H falls entirely within the span of the semiconductor die 300, but the disclosure is not limited thereto. Furthermore, whilst two top packages 700A, 700B are shown, in some alternative embodiments only one top package (for example, 700A), is included in the finished semiconductor device. Even when only one top package 700A is included over the bottom package unit BPU, the top package would not entirely cover the position of the semiconductor die 300, so that the hole H can overlap with the semiconductor die 300.

In some embodiments, the hole H exposes a portion of the conductive ground plane GR. In alternative embodiments, the hole H penetrates through the conductive ground plane GR and exposes the back surface of the underlying semiconductor die 300.

In FIG. 2B is shown a top view of a manufacturing intermediate according to some embodiments of the present disclosure. Referring to FIG. 1H and FIG. 2B, the manufacturing intermediate of FIG. 2B differs from the manufacturing intermediate of FIG. 2A as two holes, H1 and H2, are formed in the underfill 800 over the semiconductor die 300. As for the hole H of FIG. 2A, each one of the holes H1 and H2 overlaps with the position of the semiconductor die 300.

In FIG. 2C is shown a top view of a manufacturing intermediate according to some embodiments of the present disclosure. Referring to FIG. 1H and FIG. 2C, the manufacturing intermediate of FIG. 2C differs from the manufacturing intermediate of FIG. 2A for the relative disposition of the semiconductor die 300, the top packages 700A, 700B, the conductive ground plane GR and the hole H. More specifically, the conductive ground plane GR and the hole H are disposed at or around a first corner C1 of the bottom package units BPU, with the two top packages 700A and 700B disposed along the remaining edges of the bottom package units BPU. In other words, according to some embodiments illustrated in FIG. 2C, the hole H is disposed beside the two top packages 700A, 700B rather than in between. In some embodiments, as shown in FIG. 2C, the hole H has a pair of side surfaces S1 and S2 having a common edge, and the side surface S1 faces the top package 700A, while the side surface S2 faces the top package 700B.

Referring to FIG. 1I, in some embodiments, an adhesion layer 910 is blanketly formed on the exposed surfaces of the top packages 700A, 700B and the reconstructed wafer RW. In some embodiments, the adhesion layer 910 covers the exposed surfaces of the top packages 700A, 700B, the underfill 800, and the portions of the back-side redistribution structure that are covered neither by the top packages 700A, 700B nor by the underfill 800. In some embodiments, the adhesion layer 910 is conformally formed covering the sidewalls 700s and the top surfaces 700t of the top packages 700A, 700B and covering the side surfaces of the hole H and the exposed conductive ground plane GR. That is, the adhesion layer 910 extends along the side surfaces of the hole H to contact the conductive ground plane GR. Whilst in FIG. 1I the adhesion layer 910 is shown to reach the back-side redistribution structure 100, at the edges of the reconstructed wafer RW it may even reach the front-side redistribution structure 500. The adhesion layer 910 may be formed through, for example, a sputtering process, a physical vapor deposition (PVD) process, or the like. In some embodiments, the adhesion layer 910 includes, for example, copper, tantalum, titanium-copper alloys, or other suitable metallic materials. In some embodiments, the adhesion layer 910 includes, for example, polymers, hybrid materials or other suitable materials. In some embodiments, the formation of the adhesion layer 910 is optional and may be skipped.

Referring to FIG. 1J, in some embodiments, a heat dissipating structure 900 is formed over the top packages 700A, 700B and the reconstructed wafer RW by applying a thermally conductive material (not shown) and then following a curing step. In some embodiments, where an adhesion layer 910 is included, the heat dissipating structure 900 is formed directly on the adhesion layer 910 by distributing the thermally conductive material on and over the adhesion layer 910. In some alternative embodiments, the formation of adhesive layer 910 is omitted, and the thermally conductive material is applied over the exposed surfaces of the top packages 700A, 700B and the reconstructed wafer RW, and the heat dissipating structure 900 is in direct contact with the exposed surfaces of the top packages 700A, 700B, the underfill 800, and the redistribution structure 100. In some embodiments, the thermally conductive material includes metals, metal alloys or other thermal conductive metallic materials. In some embodiments, the thermally conductive material is a silver paste. In some alternative embodiments, a solder-based paste is used as thermally conductive material. In some embodiments, the thermally conductive material includes eutectic solder containing lead or lead-free. In some embodiments, the thermally conductive material includes solder containing Sn—Ag, Sn—Cu, Sn—Ag—Cu, or similar soldering alloys. In some embodiments, the thermally conductive material includes non-eutectic solder. In some embodiments, the thermally conductive material includes ceramics, carbon fiber, graphene, hybrid polymers or other thermal conductive materials. In some embodiments, the thermally conductive material has a thermal conductivity equivalent to or larger than 1.5 watts per kelvin-meter (W/(K·m)). The choice of the thermally conductive material may be dictated by considerations of desired performances and production costs.

In some embodiments, as shown in FIG. 1J, the heat dissipating structure 900 includes at least a thermal relaxation block 920 disposed within and filling the hole H. In some embodiments, the thermal relaxation block 920 is disposed on the adhesion layer 910 and surrounded by the adhesion layer 910 and the thermal relaxation block 920 extends vertically towards the back-side redistribution structure 100 of the bottom package structure BP. In some embodiments, when the formation of the adhesion layer 910 is omitted, the thermal relaxation block 920 contacts the side surfaces of the hole H and reaches and contacts the conductive ground plane GR of the back-side redistribution structure 100. As the thermal relaxation block 920 is formed by filling the hole H, a vertical projection of the thermal relaxation block 920 falls within the span of the semiconductor die 300 of the bottom package structure BP. In some embodiments, a vertical projection of the thermal relaxation block 920 overlaps with the active surface 300a of the semiconductor die 300. The thermal relaxation block 920 provides an efficient dissipation channel for the heat produced by the operation of the semiconductor die 300. In some embodiments, the heat dissipating structure 900 may further include a wall portion 930 covering the outer side surfaces 700s of the top packages 700A, 700B, but the disclosure is not limited thereto. In some embodiments, the heat dissipating structure 900 further includes a cap portion 940 extending over the thermal relaxation block 920 and the top surfaces 700t of the top packages 700A, 700B. In some embodiments, the several portions of the heat dissipating structure 900 are formed during the same production step. In some embodiments, a material of the wall portion 930 and cap portion 940 is the same as a material of the thermal relaxation block 920, but the disclosure is not limited thereto. In some alternative embodiments, a material of the cap portion 940 is different from a material of the thermal relaxation block 920. In some embodiments, the wall portion 930 and the cap portion 940 of the heat dissipating structure 900 help to increase the thermal relaxation rate of the produced semiconductor package.

In some embodiments, as shown in FIG. 1K and FIG. 1L, a singulation step is performed to separate the individual packages 10, for example, by cutting through the reconstructed wafer RW along the scribing lanes SP arranged between bottom package units BPU. Side portions of the heat dissipating structure 900 may also be removed during the singulation step. As shown in FIG. 1K, in some embodiments adjacent packages 10 may be separated by cutting through the scribing lanes SP of the reconstructed wafer RW and, optionally, the adhesion layer 910 during the singulation step. In some embodiments, the singulation process typically involves performing a wafer dicing process with a rotating blade and/or a laser beam.

After the singulation step, a plurality of semiconductor packages 10 are obtained. An exemplary cross-sectional view of the semiconductor package 10 according to some embodiments of the disclosure is illustrated in FIG. 1L. Based on the above, the semiconductor package 10 includes the bottom package BP1 (similar to the bottom package unit BPU), one or more top packages 700A, 700B, and the heat dissipating structure 900. The bottom package BP1 includes the semiconductor die 300 sandwiched between the front-side redistribution structure 500 and the back-side redistribution structure 100. The conductive structures 200 provide electrical connection between the front-side redistribution structure 500 and the back-side redistribution structure 100. The semiconductor die 300 and the conductive structure 200 are embedded in the encapsulant 400. In some embodiments, connective terminals 600 are disposed on the front-side redistribution structure 500 for electrically connecting the semiconductor package 10 with other electronic devices (not shown). In some embodiments, an underfill 800 is disposed between the top packages 700A, 700B and the bottom package BP. In some embodiments, the underfill 800 may present one or more holes H extending towards the back-side redistribution structure 100. A first portion of the heat dissipating structure 900 may fill the holes H, forming one or more thermal relaxation blocks 920. In some embodiments, the heat dissipating structure 900 further includes a wall portion 930 covering the side surfaces 700s of the top packages 700A and 700B. In some embodiments, the heat dissipating structure 900 includes a cap portion 940 extending over the thermal relaxation block 920 and the top packages 700A, 700B. Because the heat dissipating structure 900 is in direct contact with the bottom package BP, and the thermal relaxation block 920 overlaps with the semiconductor die 300, a heat path can be directly formed at the back surface 300b of the semiconductor die 300. As such, the semiconductor package 10 can efficiently dissipate the heat generated during its operation, and operation with powers of above 5 W can be achieved.

Figure 1M:
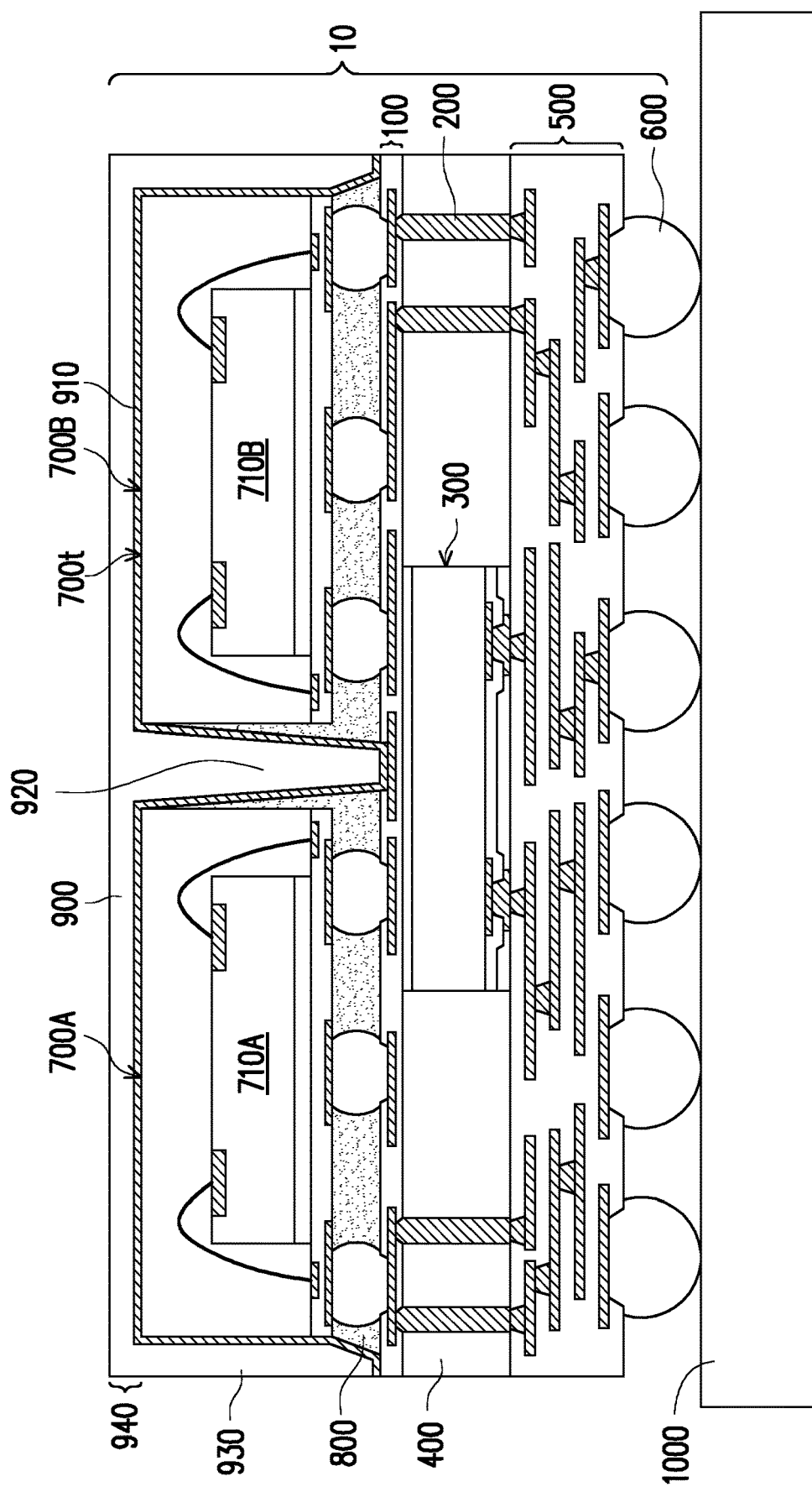
FIG. 1M shows a schematic cross-sectional view of a semiconductor package connected to a circuit substrate according to some embodiments of the present disclosure.

According to some embodiments, the semiconductor package 10 may be connected to a circuit substrate 1000 such as a motherboard, a printed circuit board, or the like, as shown in FIG. 1M.

Figure 3:
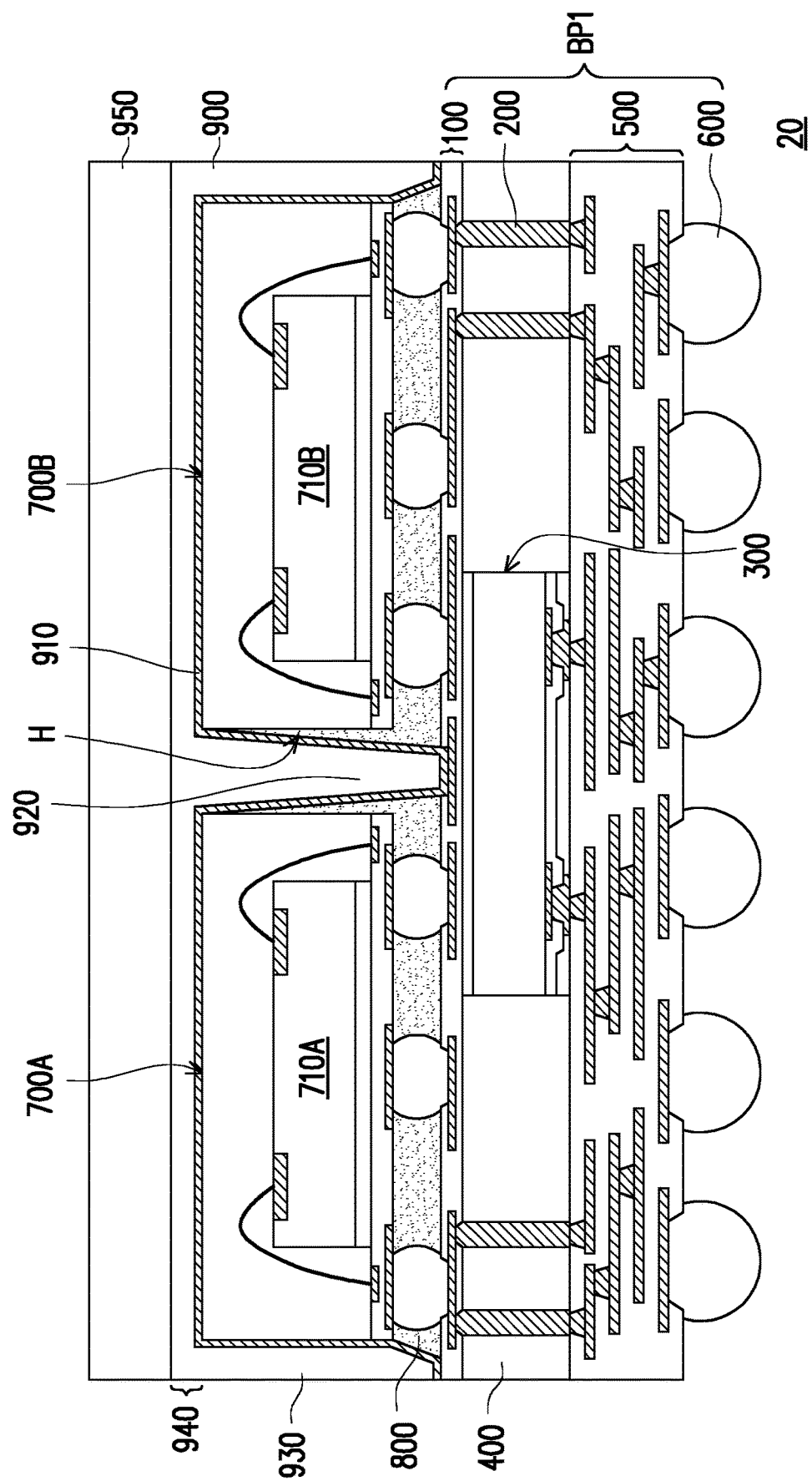
FIG. 3 shows a schematic cross-sectional view of a semiconductor package according to some embodiments of the present disclosure.

In FIG. 3 is shown a schematic cross-sectional view of a semiconductor package 20 according to some embodiments of the present disclosure. The semiconductor package 20 of FIG. 3 may contain similar components to the semiconductor package 10 of FIG. 1L, and the same or similar reference numerals are used to indicate analogous components between the two packages 10 and 20. The semiconductor package 20 differs from the semiconductor package 10 as the heat dissipating structure further includes a heat spreader 950 connected to the cap portion 940. In some embodiments, the heat spreader 950 is attached to cap portion 940 through a thermal interface material layer (not shown), an adhesive (not shown), or a combination thereof. In some embodiments, the heat spreader 950 consists of a block of thermally conductive material that promotes dissipation of the heat produced while operating the semiconductor die 300 or the top packages 700A, 700B. In some embodiments, the heat spreader 950 is a laminated structure comprising a plurality of different metallic or thermally conductive layers.

Figure 4:
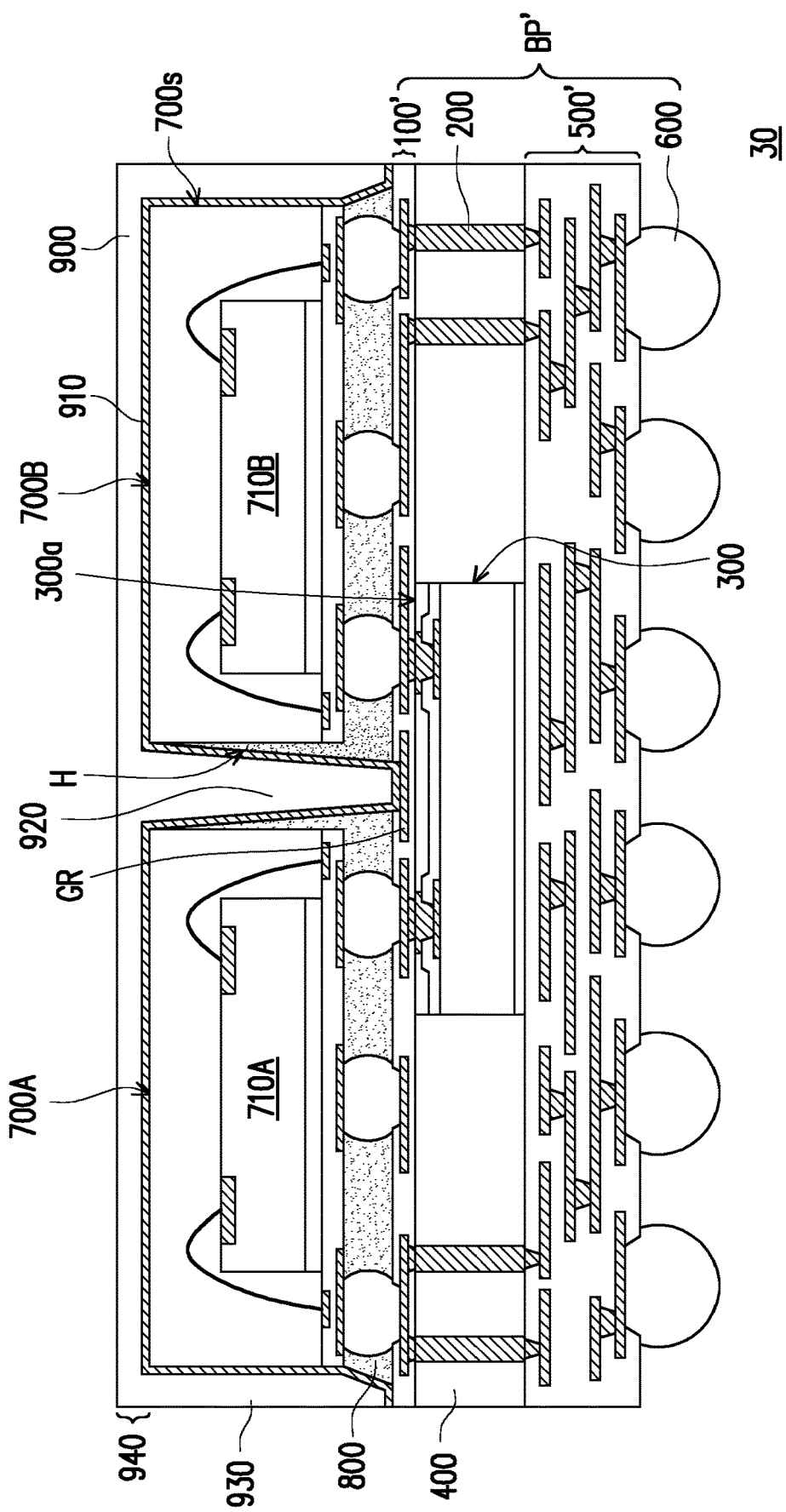
FIG. 4 shows a schematic cross-sectional view of a semiconductor package according to some embodiments of the present disclosure.

In FIG. 4 is shown a cross-sectional view of a semiconductor package 30 according to some embodiments of the present disclosure. The semiconductor package 30 of FIG. 4 may contain similar components to the semiconductor package 10 of FIG. 1L, and the same or similar reference numerals are used to indicate analogous components between the two packages 10 and 30. The semiconductor package 30 of FIG. 4 differs from the semiconductor package 10 of FIG. 1L as the semiconductor die 300 in the bottom package BP' is disposed in a face-up configuration. That is, an active surface 300a of the semiconductor die 300 is closer to the top packages 700A, 700B than to the connective terminals 600. In some embodiments, production of the bottom package BP' may include the following steps. The redistribution structure 500', that may now be referred to as a back-side redistribution structure, may be produced first over a temporary carrier (not shown). The conductive structures 200 and the semiconductor die 300 may be produced over the redistributions structure 500'. The semiconductor die 300 may be disposed in a face-up configuration over the redistribution structure 500'. The die 300 and the conductive structure 200 may be embedded in the encapsulant 400, and the redistribution structure 100', that may now be referred to as a front-side redistribution structure, may be subsequently formed.

In some embodiments, the underfill 800 is disposed between the top packages 700A, 700B and the bottom package BP'. In some embodiments, the underfill 800 may present one or more holes H extending towards the front-side redistribution structure 100'. Each hole H may expose a conductive pattern of the front-side redistribution structure 100'. In some embodiments, the conductive pattern includes a conductive ground plane GR or functions as a conductive ground plane for the package. A first portion of the heat dissipating structure 900 may fill each hole H, forming one or more thermal relaxation blocks 920. In some embodiments, a thermal connection is established between the semiconductor die 300 and the thermal relaxation block 920. In some embodiments, the heat dissipating structure 900 further includes a wall portion 930 covering the side surfaces 700s of the top packages 700A and 700B. In some embodiments, the heat dissipating structure 900 includes a cap portion 940 extending over the thermal relaxation block 920 and the top packages 700A, 700B. In some embodiments, the thermal relaxation block 920, the wall portion 930 and the cap portion 940 are disposed on an optional adhesion layer 910. Because the heat dissipating structure 900 can establish an efficient thermal exchange with the bottom package BP', a heat path can be formed reaching the active surface 300a of the semiconductor die 300. As such, the semiconductor package 30 can efficiently dissipate the heat generated during operation, and working powers of 5 W or above can be reliably achieved.

Figure 5A:
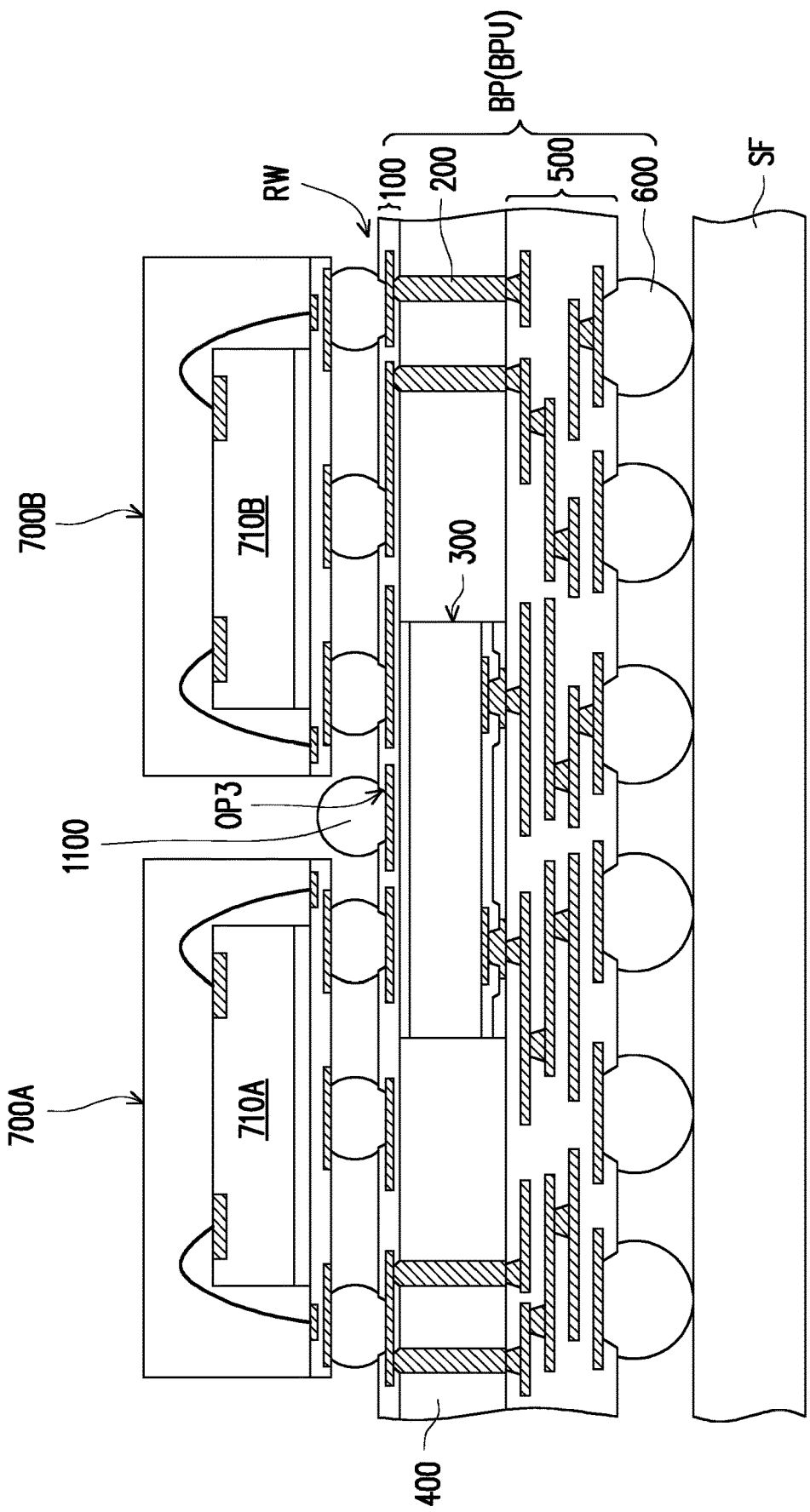
FIG. 5A through FIG. 5C show schematic cross-sectional views of structures produced at various stages of a manufacturing method of a semiconductor package according to some embodiments of the present disclosure.
Figure 5B:
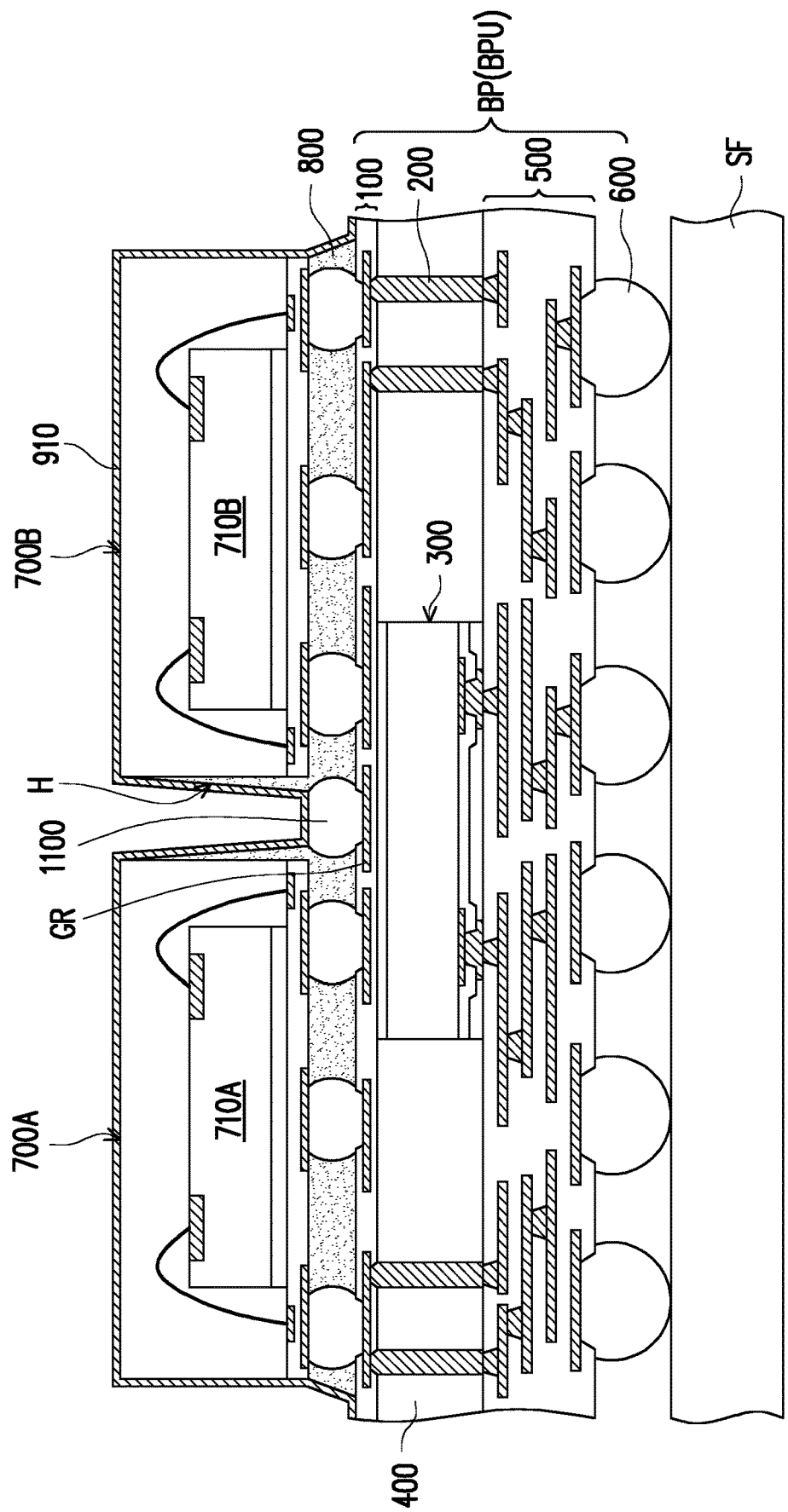
Figure 5C:
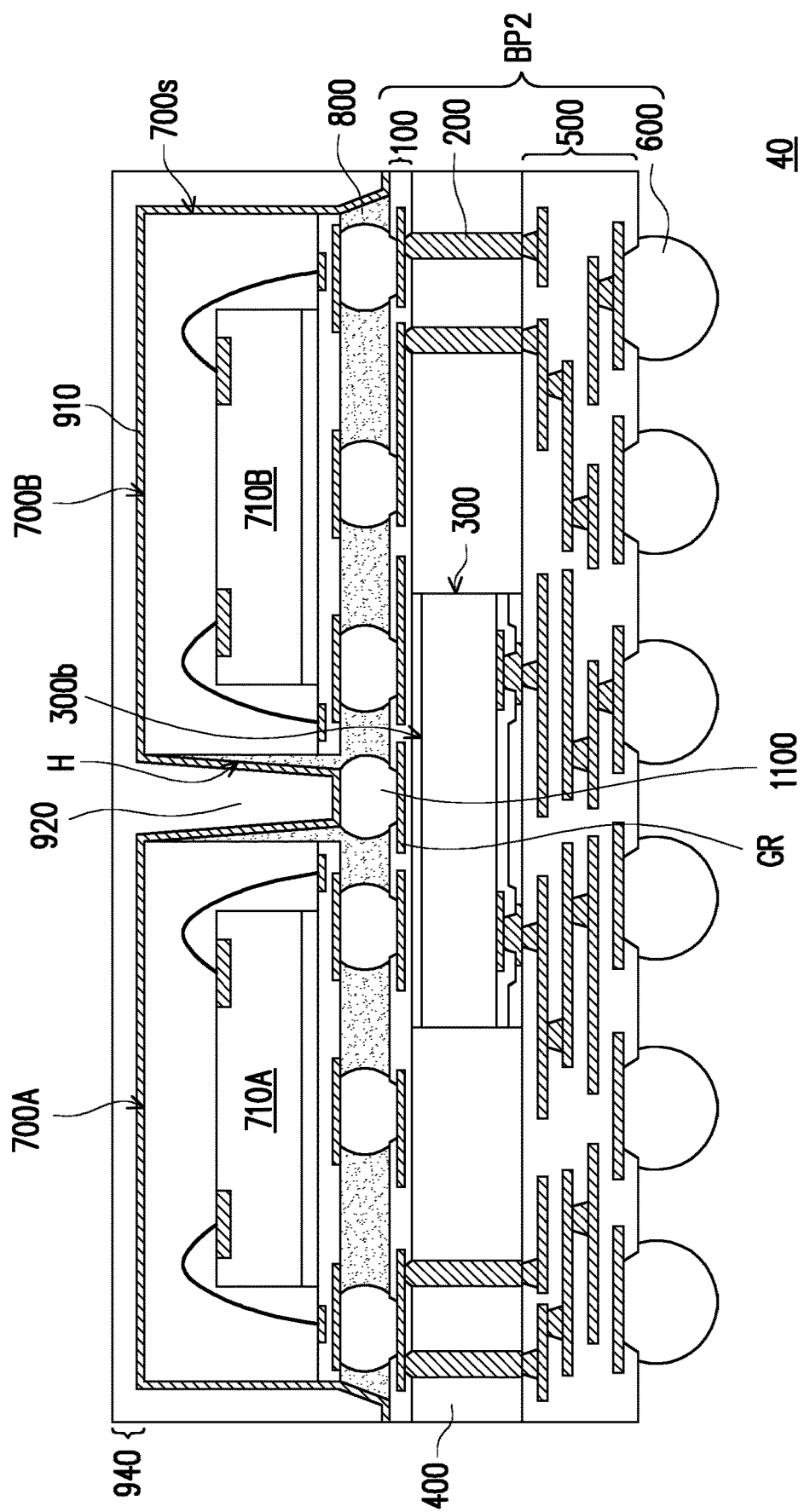

FIG. 5A through FIG. 5C show schematic cross-sectional views illustrating structures produced at various stages of a manufacturing method of a semiconductor package 40 shown in FIG. 5C. The manufacturing intermediate shown in FIG. 5A may be formed following similar steps as previously described with reference to FIG. 1F, and a detailed description thereof is omitted herein. Briefly, the manufacturing intermediate of FIG. 5A includes a bottom package structure BP and one or more top packages 700A, 700B. In some embodiments, multiple bottom package units BPU are formed in a reconstructed wafer RW disposed over a supporting frame SF. Each bottom package structure BP includes a semiconductor die 300 sandwiched between a front-side redistribution structure 500 and a back-side redistribution structure 100. Conductive structures 200 provide electrical connection between the front-side redistribution structure 500 and the back-side redistribution structure 100. The semiconductor die 300 and the conductive structures 200 are embedded in an encapsulant 400. A difference between the structure shown in FIG. 5A and the corresponding structure shown in FIG. 1F is the presence of an additional opening OP3 in the back-side redistribution structure 100 where a conductive ball 1100 has been placed. In some embodiments the conductive ball 1100 is a solder ball, but the disclosure is not limited thereto. In some embodiments, the opening OP3 exposes a conductive pattern of the back-side redistribution structure 100. In some embodiments, the conductive pattern includes a conductive ground plane GR or functions as a conductive ground plane for the package, and the conductive ball 1100 is in contact with the conductive ground plane GR.

In some embodiments, as shown in FIG. 5B, an underfill 800 may be produced between the top packages 700A, 700B and the back-side redistribution structure 100, and may also be disposed in between the top packages 700A and 700B. A material and a production method of the underfill 800 may be similar to what previously described with reference to FIG. 1G and a detailed description thereof is omitted herein. In some embodiments, a hole H is opened in the underfill to expose the conductive ball 1100. In some embodiments, the hole H is opened via lased drilling, and material is removed from the underfill 800 until the conductive ball 1100 is reached. In some embodiments, an upper portion of the conductive ball 1100 may also be removed. In some embodiments, an adhesion layer 910 is formed, similarly to what previously described with reference to FIG. 1I, and a detailed description thereof is omitted herein. In some embodiments, the adhesion layer 910 is not formed. Similarly to what described with reference to FIG. 1J to FIG. 1L, distribution of a thermally conductive material (not shown), followed by a curing step, a singulation step and removal from the supporting frame SF produces the semiconductor package 40 shown in FIG. 5C.

Based on the above, a semiconductor package 40 includes the bottom package BP2, one or more top packages 700A, 700B, and the heat dissipating structure 900. The bottom package BP2 includes the semiconductor die 300 sandwiched between the front-side redistribution structure 500 and the back-side redistribution structure 100. The conductive structures 200 provide electrical connection between the front-side redistribution structure 500 and the back-side redistribution structure 100. The semiconductor die 300 and the conductive structure 200 are embedded in the encapsulant 400. In some embodiments, the underfill 800 is disposed between the top packages 700A, 700B and the bottom package BP2. In some embodiments, the underfill 800 may present one or more holes H extending towards the back-side redistribution structure 100. Each hole H may expose a conductive ball 1100 connected to a conductive pattern GR of the redistribution structure 100. A first portion of the heat dissipating structure 900 may fill each hole H, forming one or more thermal relaxation blocks 920. In some embodiments, a thermal connection is established between the bottom package BP2 and the thermal relaxation block 920 through the conductive ball 1100. In some embodiments, the heat dissipating structure 900 further includes a wall portion 930 covering the side surfaces 700s of the top packages 700A and 700B. In some embodiments, the heat dissipating structure 900 includes a cap portion 940 extending over the thermal relaxation block 920 and the top packages 700A, 700B. Because the heat dissipating structure 900 can establish an efficient thermal exchange with the bottom package BP2 through the conductive ball 1100, and the thermal relaxation block 920 overlaps with the semiconductor die 300, a heat path can be directly formed at the back surface 300b of the semiconductor die 300. As such, the semiconductor package 40 can efficiently dissipate the heat generated during its operation, and operation with powers of 5 W or above can be achieved.

Figure 6A:
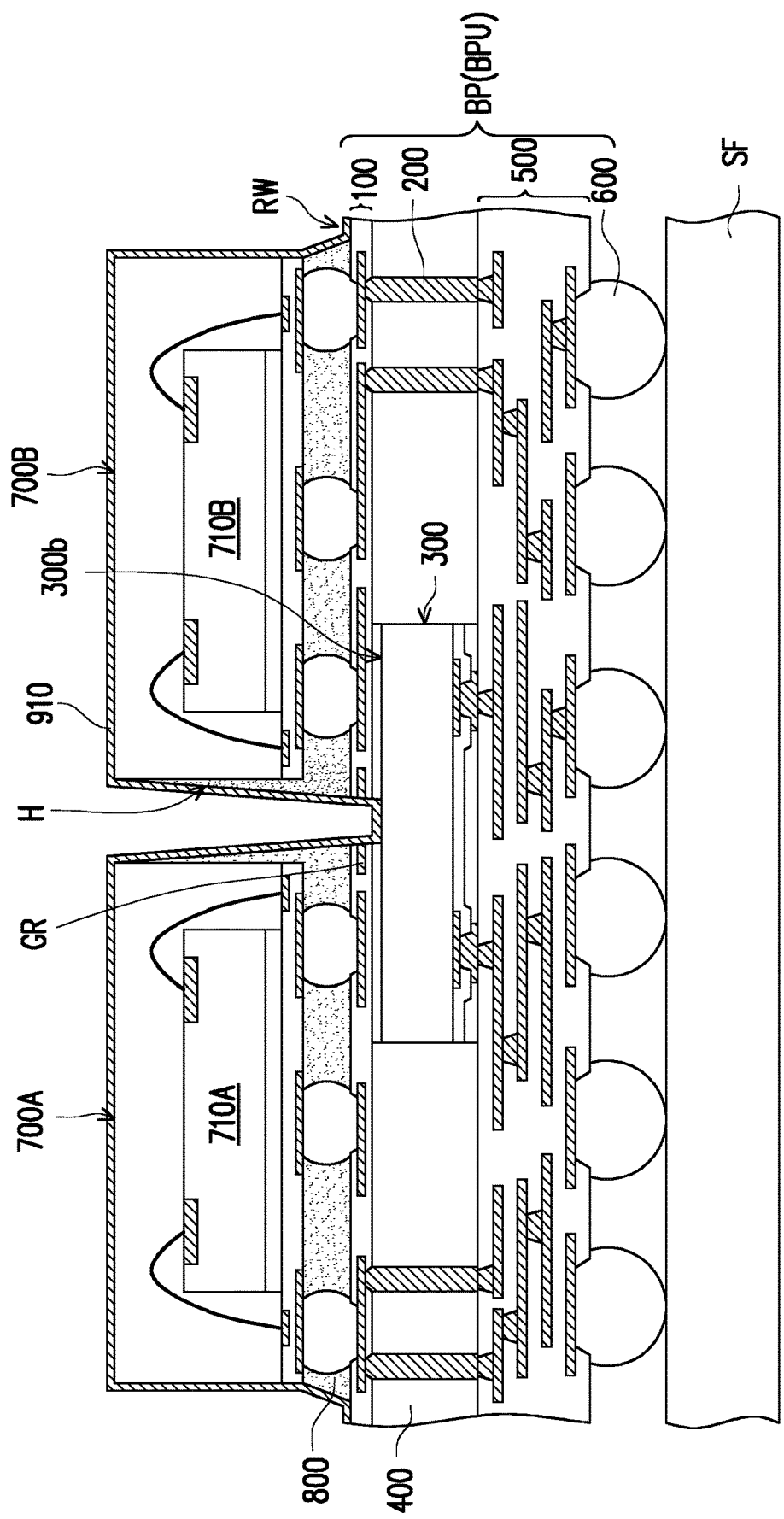
FIG. 6A through FIG. 6B show schematic cross-sectional views of structures produced at various stages of a manufacturing method of a semiconductor package according to some embodiments of the present disclosure.
Figure 6B:
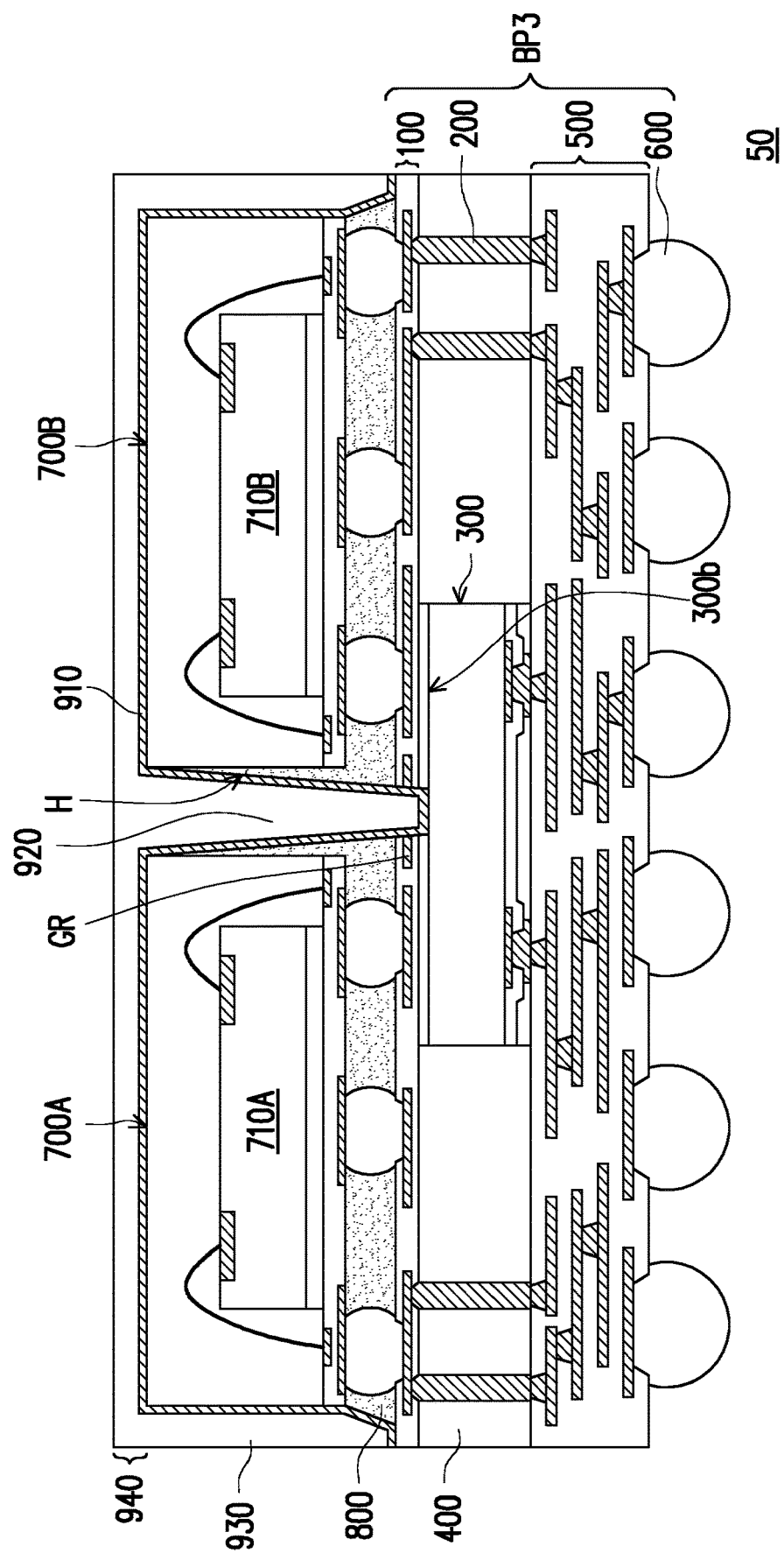

FIG. 6A and FIG. 6B show schematic cross-sectional views produced at various stages of a manufacturing method of a semiconductor package 50 shown in FIG. 6B. The manufacturing intermediate shown in FIG. 6A may be formed following similar steps as previously described with reference to FIG. 1A to FIG. 1I, and a detailed description thereof is omitted herein. Briefly, the manufacturing intermediate of FIG. 6A includes a bottom package structure BP and one or more top packages 700A, 700B. In some embodiments, multiple bottom package units BPU are formed in a reconstructed wafer RW disposed over a supporting frame SF. Each bottom package structure BP includes a semiconductor die 300 sandwiched between a front-side redistribution structure 500 and a back-side redistribution structure 100. Conductive structures 200 provide electrical connection between the front-side redistribution structure 500 and the back-side redistribution structure 100. The semiconductor die 300 and the conductive structures 200 are embedded in an encapsulant 400. An underfill 800 is formed between the top packages 700A, 700B and the back-side redistribution structure 100. The underfill 800 may have originally extended in between the top packages 700A, 700B, before a hole H was opened therein. In some embodiments, the hole H is opened via laser drilling. A difference between the structure shown in FIG. 6A and the corresponding structure shown in FIG. 1I is the fact that the hole H exposes the semiconductor die 300. In other words, the drilling step was performed in such a way to stop only when the back surface 300b of the die 300 was reached. In some embodiments, the back-side redistribution structure 100 includes a conductive pattern. In some embodiments, the conductive pattern includes a conductive ground plane GR or functions as a conductive ground plane for the package. In some embodiments, the conductive ground plane GR is disposed along the drilling direction, so that the laser may perforate the conductive ground plane GR while opening the hole H. In some embodiments, an adhesion layer 910 is blanketly formed over the reconstructed wafer RW. Distribution of the thermally conductive material (not shown), followed by a curing step, a singulation step, and removal from the supporting frame SF produces the semiconductor package 50 shown in FIG. 6B.

Based on the above, a semiconductor package 50 shown in FIG. 6B includes the bottom package BP3, one or more top packages 700A, 700B, and the heat dissipating structure 900. The bottom package BP3 includes the semiconductor die 300 sandwiched between the front-side redistribution structure 500 and the back-side redistribution structure 100. The conductive structures 200 provide electrical connection between the front-side redistribution structure 500 and the back-side redistribution structure 100. The semiconductor die 300 and the conductive structure 200 are embedded in the encapsulant 400. In some embodiments, the underfill 800 is disposed between the top packages 700A, 700B and the bottom package BP3. In some embodiments, the underfill 800 may present one or more holes H extending towards the back-side redistribution structure 100. Each hole H may expose the back surface 300b of the semiconductor die 300. A first portion of the heat dissipating structure 900 may fill each hole H, forming one or more thermal relaxation blocks 920. In some embodiments, a thermal connection is directly established between the semiconductor die 300 and the thermal relaxation block 920. In some embodiments, the heat dissipating structure 900 further includes a wall portion 930 covering the side surfaces 700s of the top packages 700A and 700B. In some embodiments, the heat dissipating structure 900 includes a cap portion 940 extending over the thermal relaxation block 920 and the top packages 700A, 700B. In some embodiments, the thermal relaxation block 920, the wall portion 930 and the cap portion 940 are disposed on an optional adhesion layer 910. Because the heat dissipating structure 900 can establish an efficient thermal exchange with the bottom package BP3, and the thermal relaxation block 920 directly contacts the semiconductor die 300, a heat path can be formed reaching the back surface 300b of the semiconductor die 300. As such, the semiconductor package 50 can efficiently dissipate the heat generated during operation, and working powers of 5 W or above can be reliably achieved.

In light of the present disclosure, when stacking semiconductor packages, formation of a heat dissipating structure contacting a bottom package ensures efficient dissipation of the heat produced during operation of the bottom package. As such, semiconductor devices that include the heat dissipating structure of the present disclosure can operate at higher working powers. As such, thermal performance and reliability of the semiconductor devices are also improved.

In some embodiments of the present disclosure, a semiconductor package includes a bottom package, a top package, and a heat dissipating structure. The bottom package includes a redistribution structure, and a die disposed on a first surface of the redistribution structure and electrically connected to the redistribution structure. The top package is disposed on a second surface of the redistribution structure opposite to the first surface. The heat dissipating structure is disposed over the bottom package, and includes a thermal relaxation block. The thermal relaxation block contacts the redistribution structure and is disposed beside the top package.

In some embodiments of the present disclosure, a semiconductor package includes a bottom package, a plurality of top packages, and a heat dissipation module. The bottom package includes: a die, a redistribution structure, a back-side redistribution layer and a conductive structure. The die has an active surface and a back surface opposite to the active surface. The redistribution structure is disposed on the active surface of the die and is electrically connected with the die. The back-side redistribution layer is disposed on the back surface of the die. The conductive structure electrically connects the redistribution structure and the back-side redistribution layer. The plurality of top packages is disposed on the bottom package. Top packages of the plurality of top packages are arranged side by side and separated from each other. The heat dissipation module includes a top layer and a thermally conductive block. The top layer is disposed over and covers the plurality of top packages. The thermally conductive block is disposed between at least two top packages of the plurality of top packages, and extends in a vertical direction from the top layer toward the back-side redistribution layer.

In some embodiments of the present disclosure, a manufacturing method of a semiconductor package includes at least the following steps. A bottom package is provided. The bottom package includes a die and a redistribution structure electrically connected to the die. A first top package and a second top package are disposed on a surface of the redistribution structure further away from the die. An underfill is formed into the space between the first and second top packages and between the first and second top packages and the bottom package. The underfill covers at least a side surface of the first top package and a side surface of the second top package. A hole is opened in the underfill within an area overlapping with the die between the side surface of the first top package and the side surface of the second top package. A thermally conductive block is formed in the hole by filling the hole with a thermally conductive material.

In some embodiments of the present disclosure, a manufacturing method of a semiconductor package includes at least the following steps. A bottom package comprising a semiconductor die is provided. A top package is disposed on the bottom package. The top package is electrically connected to the bottom package by a plurality of conductive balls. An underfill is disposed between the top package and the bottom package. The underfill surrounds the conductive balls and is further disposed on a side of the top package. A portion of the underfill is removed to form a hole. The hole is located at the side of the top package. A thermally conductive material is disposed within the hole and over the top package. The thermally conductive material disposed within the hole and over the top package is cured.

In some embodiments of the present disclosure, a manufacturing method of a semiconductor package includes at least the following steps. A redistribution structure is formed. The redistribution structure is electrically connected to an encapsulated semiconductor die. A first package and a second package are connected to the redistribution structure via a plurality of conductive balls. The first package and the second package are separated from each other by a gap. An adhesion layer is disposed over the redistribution structure, on the first package and the second package, and in the gap. A thermally conductive material is applied on the adhesion layer. The thermally conductive material is cured after the thermally conductive material is applied on the adhesion layer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor package, comprising:
    providing a bottom package, wherein the bottom package includes a die and a redistribution structure electrically connected to the die;
    disposing a first top package, a conductive ball and a second top package on a surface of the redistribution structure further away from the die;
    filling an underfill into a space between the first and second top packages and between the first and second top packages and the bottom package, wherein the underfill covers a side surface of the first top package and a side surface of the second top package;
    opening a hole in the underfill within an area overlapping with the die between the side surface of the first top package and the side surface of the second top package, wherein the hole exposes the conductive ball; and
    forming a thermally conductive block in the hole by filling the hole with a thermally conductive material.

2. The method of claim 1, wherein the conductive ball is connected to a conductive ground plane of the redistribution structure.

3. The method of claim 1, wherein filling the hole with a thermally conductive material further comprises applying the thermally conductive material over top surfaces of the first and second top packages and into the hole.

4. The method of claim 1, wherein opening the hole comprises performing laser drilling.

5. The method of claim 1, wherein forming the thermally conductive block further comprises curing the thermally conductive material.

6. The method of claim 1, further comprising forming an adhesion layer in the hole and on the first and second top packages before forming a thermally conductive block in the hole.

7. A manufacturing method of a semiconductor package, comprising:
   providing a bottom package comprising a semiconductor die and a ground plane;
   disposing a top package on the bottom package, the top package being electrically connected to the semiconductor die of the bottom package by a plurality of conductive balls;
   disposing an underfill between the top package and the bottom package, wherein the underfill surrounds the conductive balls and is further disposed on a side of the top package;
   removing a portion of the underfill to form a hole at the side of the top package exposing the ground plane;
   forming an electrically conductive adhesion layer on the top package and in the hole, and the electrically conductive adhesion being in contact with the exposed ground plane;
   disposing a thermally conductive material within the hole and over the top package; and
   curing the thermally conductive material disposed within the hole and over the top package.

8. The method of claim 7, wherein the electrically conductive adhesion layer is conformally formed in the hole and on the top package before disposing the thermally conductive material.

9. The method of claim 8, wherein the electrically conductive adhesion layer includes at least one material selected from copper, tantalum, and titanium-copper alloys.

10. The method of claim 7, wherein the thermally conductive material includes a thermally conductive paste.

11. The method of claim 7, wherein, after curing, the thermally conductive material disposed over the top package forms a cap portion, and the thermally conductive material disposed within the hole forms a thermal relaxation block extending from the cap portion towards the bottom package.

12. The method of claim 7, wherein the top package is one of a plurality of top packages which are disposed on the bottom package.

13. The method of claim 7, wherein providing the bottom package comprises:
   forming a first redistribution structure,
   disposing the semiconductor die on the first redistribution structure;
   forming conductive structures on the first redistribution structure;
   encapsulating the semiconductor die and the conductive structures in an encapsulant; and
   forming a second redistribution structure on the encapsulated semiconductor die,
   wherein the first redistribution structure is electrically connected to the encapsulated semiconductor die via the conductive structures and the second redistribution structure, and the top package is disposed on the first redistribution structure.

14. A manufacturing method of a semiconductor package, comprising:
   forming a redistribution structure, the redistribution structure being electrically connected to an encapsulated semiconductor die;
   connecting a first package and a second package to the redistribution structure via conductive balls, the first package and the second package being separated from each other by a gap;
   disposing an electrically conductive adhesion layer over the redistribution structure, on the first package and the second package, and in the gap;
   applying a thermally conductive material on the electrically conductive adhesion layer; and
   curing the thermally conductive material after the thermally conductive material is applied on the electrically conductive adhesion layer.

15. The method of claim 14, further comprising:
   forming an underfill in the gap between the first package and the second package, wherein the underfill at least partially covers facing side surfaces of the first package and the second package; and
   removing a portion of the underfill from the gap before disposing the electrically conductive adhesion layer,
   wherein a remaining portion of the underfill is disposed between the electrically conductive adhesion layer and the facing side surfaces of the first package and the second package.

16. The method of claim 15, wherein the redistribution structure comprises a conductive ground plane, and the method further comprises removing a portion of the redistribution structure to expose the conductive ground plane.

17. The method of claim 16, wherein the portion of the redistribution structure and the portion of the underfill are removed via laser drilling.

18. The method of claim 16, wherein the encapsulated semiconductor die is partially exposed after removal of the portion of the redistribution structure.

19. The method of claim 14, further comprising connecting an additional conductive ball to the redistribution structure beside the conductive balls connecting the first package and the second package to the redistribution structure, wherein the electrically conductive adhesion layer is further disposed on the additional conductive ball.

20. The method of claim 11, further comprising attaching a heat spreader on the cap portion.

* * * * *